United States Patent
Yoon et al.

(10) Patent No.: US 11,594,295 B2
(45) Date of Patent: Feb. 28, 2023

(54) NONVOLATILE MEMORY DEVICE AND METHOD OF OPERATING THE SAME

(71) Applicant: Samsung Electronics Co., Ltd., Suwon-si (KR)

(72) Inventors: Myoung-Won Yoon, Suwon-si (KR); Sang-Hyun Joo, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/580,062

(22) Filed: Jan. 20, 2022

(65) Prior Publication Data

US 2022/0139470 A1 May 5, 2022

Related U.S. Application Data

(63) Continuation of application No. 17/035,188, filed on Sep. 28, 2020, now Pat. No. 11,232,845.

(30) Foreign Application Priority Data

Jan. 22, 2020 (KR) ........................ 10-2020-0008313

(51) Int. Cl.
| | |
|---|---|
| G11C 7/14 | (2006.01) |
| G11C 16/34 | (2006.01) |
| G11C 16/04 | (2006.01) |
| G11C 16/16 | (2006.01) |
| G11C 16/28 | (2006.01) |
| G11C 16/10 | (2006.01) |

(52) U.S. Cl.
CPC ........ *G11C 16/349* (2013.01); *G11C 16/0483* (2013.01); *G11C 16/10* (2013.01); *G11C 16/16* (2013.01); *G11C 16/28* (2013.01); *G11C 16/3445* (2013.01)

(58) Field of Classification Search
USPC ...................................... 365/210.1
See application file for complete search history.

(56) References Cited

U.S. PATENT DOCUMENTS

| | | | |
|---|---|---|---|
| 8,310,873 B2 | 11/2012 | Ueno et al. | |
| 9,257,195 B2 | 2/2016 | Oh et al. | |
| 9,478,296 B2 | 10/2016 | Nam | |
| 9,627,084 B2 | 4/2017 | Kwak et al. | |
| 9,704,590 B2 | 7/2017 | Nam et al. | |
| 9,959,933 B2 | 5/2018 | Lee et al. | |
| 2019/0171381 A1* | 6/2019 | Ioannou | G06F 3/0679 |
| 2019/0244673 A1 | 8/2019 | Yang et al. | |

* cited by examiner

*Primary Examiner* — Jason Lappas
(74) *Attorney, Agent, or Firm* — Muir Patent Law, PLLC

(57) ABSTRACT

A nonvolatile memory device includes a memory block with an unused line connected to dummy cells and used lines connected to normal cells, and a controller which applies an erase voltage to the memory block, applies an unused line erase voltage to the unused line, and applies a word line erase voltage to the used lines during an erase operation. The dummy cells are not programmed during a program operation while the normal cells are programmed, the unused line erase voltage transits from a first voltage to a floating voltage at a first time point, and the controller reads the dummy cells and controls at least one of the magnitude of the first voltage and the first time point based on the result of reading the dummy cells.

20 Claims, 23 Drawing Sheets

NONVOLATILE MEMORY DEVICE AND METHOD OF OPERATING THE SAME

This application is a continuation of U.S. application Ser. No. 17/035,188 filed on Sep. 28, 2020 which claims priority to Korean Patent Application No. 10-2020-0008313, filed on Jan. 22, 2020, in the Korean Intellectual Property Office, the disclosure of each of which is incorporated by reference herein in its entirety.

BACKGROUND

1. Field of Disclosure

The present disclosure relates to a nonvolatile memory device and a method of operating the same.

2. Description of the Related Art

A memory device is a memory that may store data and read the data when necessary. Memory devices may be broadly divided into nonvolatile memories (NVMs) that do not lose stored data even when power is not supplied and volatile memories (VMs) that lose stored data when power is not supplied.

Characteristics of such a memory device may be changed by various causes such as the use environment, the number of uses, and the use time. Accordingly, the reliability of the memory device may be undermined. Therefore, methods of increasing the reliability of a memory device are coming to the fore.

SUMMARY

Aspects of the present disclosure provide a nonvolatile memory device having improved reliability by detecting deterioration of an unused line in advance and erasing the unused line.

Aspects of the present disclosure also provide a method of operating a nonvolatile memory device having improved reliability by detecting deterioration of an unused line in advance and erasing the unused line.

According to an exemplary embodiment of the present invention, a nonvolatile memory device includes a memory block disposed on a substrate, the memory block including a first unused line connected to a plurality of first dummy memory cells, and a plurality of used lines connected to a plurality of normal memory cells, the nonvolatile memory device being configured such that the plurality of first dummy memory cells are not programmed during a program operation which is performed on the plurality of normal memory cells, and a controller configured to perform an erase operation on the memory block, wherein the controller, in the erase operation, causes a substrate voltage to be applied to the substrate on which the memory block is disposed, a first unused line erase voltage to be applied to the first unused line, and a word line erase voltage to be applied to the plurality of used lines. During application of the substrate voltage to the substrate, the substrate voltage starts to increase from a first substrate voltage level toward a second substrate voltage level at a reference time point. During application of the first unused line erase voltage to the first unused line, the first unused line erase voltage transits from a first voltage level to a floating voltage at a first time point after the reference time point. The controller is further configured to read the plurality of erased first dummy memory cells and to control at least one of the magnitude of the first voltage level and the first time point based on the result of reading the plurality of erased first dummy memory cells.

According to an exemplary embodiment of the present invention, a nonvolatile memory device includes a memory block disposed on a substrate, the memory block including a first unused line connected to a plurality of first dummy memory cells and a plurality of used lines connected to a plurality of normal memory cells, and the nonvolatile memory device being configured such that the plurality of first dummy memory cells are not programmed during a program operation which is performed on the plurality of memory cells, and a controller configured to determine, in response to an erase command, whether the plurality of first dummy memory cells have deteriorated by reading the plurality of first dummy memory cells, and to cause, in response to the determining of the plurality of first dummy memory cells as having deteriorated, a first unused line erase voltage to be applied to the first unused line to perform an erase operation on the plurality of first dummy memory cells. During application of the first unused line erase voltage to the first unused line, the first unused line erase voltage transits from a first voltage level to a floating voltage at a first time point after a reference time point when a substrate voltage which the controller, in response to the erase command, causes to be applied to the substrate, starts to increase from a first substrate voltage level toward a second substrate voltage level.

According to an aspect of an embodiment, there is provided a nonvolatile memory device comprising a memory block which comprises an unused line connected to dummy cells and used lines connected to normal cells, and a controller which reads the dummy cells in response to an erase command and applies an unused line erase voltage to the unused line during an erase operation according to the erase command based on the result of reading the dummy cells, wherein the dummy cells are not programmed during a program operation while the normal cells are programmed, the unused line erase voltage transits from a first voltage to a floating voltage at a first time, and the dummy cells connected to the unused line are erased according to the unused line erase voltage.

According to an exemplary embodiment of the present inventive concept, a nonvolatile memory device includes a memory cell array comprising a memory block in which a ground select line connected to a plurality of ground select transistors, a first dummy word line connected to a plurality of first dummy memory cells, a plurality of word lines connected to a plurality of normal memory cells, a second dummy word line connected to a plurality of second dummy memory cells and a string select line connected to a plurality of string select transistors are sequentially stacked, and a controller configured to receive an erase command, read a plurality of threshold voltages of the plurality of ground select transistors, the plurality of first dummy memory cells, the plurality of string select transistors and the plurality of second dummy memory cells in response to the erase command, determine a short-term erase voltage to be applied to each of the string select line, the ground select line, the first dummy word line and the second dummy word line during an erase operation according to the erase command based on the result of reading the plurality of threshold voltages, and apply the short-term erase voltage to each of the ground select line, the first dummy word line, the second dummy word line and the string select line during the erase operation while a word line erase voltage is applied to the plurality of word lines.

According to an exemplary embodiment of the present inventive concept, a method of operating a nonvolatile memory device includes determining, in response to an erase command for a memory block disposed on a substrate, whether a plurality of first dummy memory cells connected to a first unused line included in a memory block have deteriorated, changing, in response to the determining of the plurality of first dummy memory cells as having deteriorated, an erase condition of the first unused line connected to the plurality of first dummy memory cells, and performing an erase operation on the memory block according to the erase command by applying a first unused line erase voltage to the first unused line according to the changed erase condition of the first unused line. The first unused line erase voltage transits from a first voltage level to a floating voltage at a first time point after a reference time point when a substrate voltage which is, in response to the erase command, applied to the substrate, starts to increase from a first substrate voltage level toward a second substrate voltage level. The plurality of first dummy memory cells are not programmed during a program operation which is applied to a plurality of memory cells connected to a plurality of used lines.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Hereinafter, embodiments according to the technical spirit of the present disclosure will be described with reference to the accompanying drawings.

Figure 1:
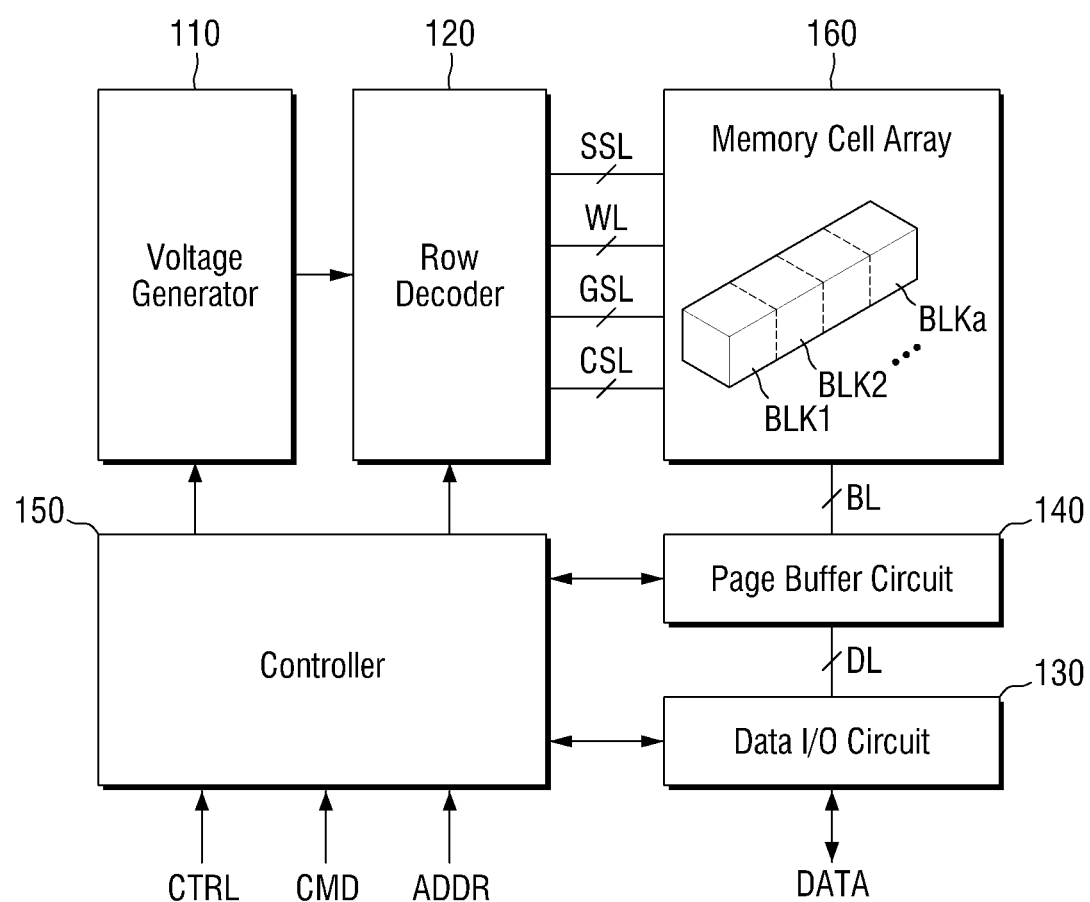
FIG. 1 is a block diagram of a nonvolatile memory device according to embodiments of the present disclosure.

Referring to FIG. 1, a nonvolatile memory device according to embodiments of the present disclosure may include a voltage generator 110, a row decoder 120, a data input/output (I/O) circuit 130, a page buffer circuit 140, a controller 150, and a memory cell array 160.

The nonvolatile memory device may include, for example, a NAND flash memory, a vertical NAND (VNAND) flash memory, a NOR flash memory, a resistive random access memory (RRAM), a phase-change memory (PRAM), a magneto resistive random access memory (MRAM), a ferroelectric random access memory (FRAM) or a spin transfer torque random access memory (STT-RAM), but embodiments are not limited to these examples.

The voltage generator 110 may generate operating voltages required for the nonvolatile memory device by using a power supply voltage. The operating voltages may include, for example, a program voltage, a pass voltage, a read voltage, a read pass voltage, a verify voltage, an erase voltage, a bit line voltage and a common source voltage, but the present disclosure is not limited thereto.

The row decoder 120 may select any one of a plurality of memory blocks BLK1 through BLKa in response to an address ADDR. In addition, the row decoder 120 may be connected to the memory cell array 160 through a plurality of word lines WL, at least one string select line SSL, and at least one ground select line GSL.

The data I/O circuit 130 may be connected to the controller 150 through bit lines BL. The data I/O circuit 130 may perform operations such as input and output based on operation signals from the controller 150. The data I/O circuit 130 may provide the address ADD, a command CMD or a control signal CTRL received from a memory controller to the controller 150.

The page buffer circuit 140 may be connected to the memory cell array 160 through the bit lines BL. The page buffer circuit 140 may provide the same voltage to each of the bit lines BL during an erase operation. The page buffer circuit 140 may receive operation signals from the controller 150. The page buffer circuit 140 may perform operations such as erase, verify and program operations according to the operation signals from the controller 150.

The controller 150 may generate operation signals such as erase, verify and program signals based on the command CMD or the control signal CTRL from the memory controller. The controller 150 may provide the generated operation signals to the voltage generator 110, the row decoder 120, the page buffer circuit 140, or the data I/O circuit 130. If necessary, the nonvolatile memory device may include more elements in addition to the illustrated elements.

The controller 150 may determine, in response to an erase command, whether an unused line included in the memory blocks BLK1 through BLKa to be described later has deteriorated. The deterioration of the unused line may be determined based on, for example, the threshold voltage distribution of dummy cells (i.e., dummy memory cells) connected to the unused line. The controller 150 may control voltages to be applied to the memory blocks BLK1 through BLKa, the unused line and used lines according to the result of reading the unused line and thus perform an erase operation. For example, the deterioration determination is checked separately on each of the dummy word lines. And the controller 150 may respectively control voltages to be applied to the dummy word lines.

After the erase operation is completed, the controller 150 may perform an erase verification operation on the dummy cells connected to the unused line. In the erase verification operation, the controller 150 may read the dummy cells connected to the unused line and terminate (i.e., abort) the erase verification operation based on the result of reading the dummy cells connected to the unused line before the erase verification operation is completed. When the erase verification operation is aborted, the corresponding memory block may be designated as a bad block.

In addition, the controller 150 may recover the dummy cells connected to the unused line by controlling a voltage to be applied to the unused line and a time when a floating voltage is applied to the unused line according to the deterioration of the unused line. A difference between the floating voltage Vf and the erase voltage Vers may not be so high as to cause Fowler-Nordheim (FN) tunneling, thus the dummy word line may be erase-inhibited.

Therefore, the nonvolatile memory device according to the embodiments of the present disclosure may determine whether the dummy cells connected to the unused line have deteriorated before performing the erase operation and perform the erase operation by controlling the voltage to be applied to the unused line and the time when the floating voltage is applied to the unused line, thereby increasing the reliability of the memory blocks BLK1 through BLKa.

The memory cell array 160 may include a plurality of memory blocks BLK1 through BLKa. Each of the memory blocks BLK1 through BLKa may be connected to the row decoder 120 through a plurality of word lines WL, at least one string select line SSL, at least one ground select line GSL, and a common source line CSL. In addition, each of the memory blocks BLK1 through BLKa may be connected to the page buffer circuit 140 through a plurality of bit lines BL. The memory cell array 160 may be a two-dimensional memory cell array or a three-dimensional memory cell array.

Figure 2:
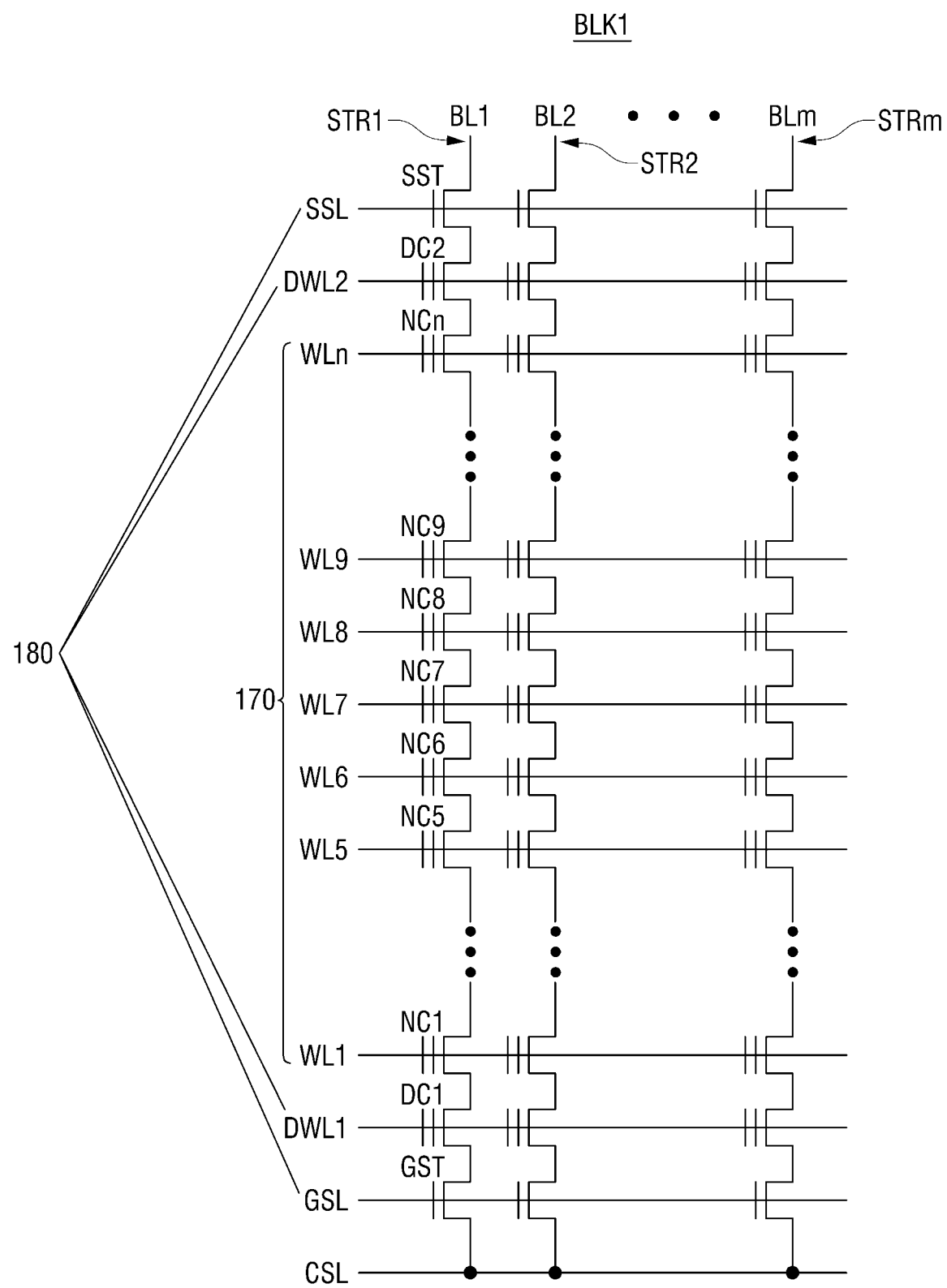
FIG. 2 is an example circuit diagram of a memory block of FIG. 1.

FIG. 2 is an example circuit diagram of a memory block BLK1 of FIG. 1.

Referring to FIG. 2, when the memory cell array 160 (see FIG. 1) is a two-dimensional memory cell array, the memory block BLK1 may include a used line 170, an unused line 180, and a common source line CSL.

The used line 170 may be connected to normal cells NC1 through NCn. Here, the normal cells (i.e., memory cells) NC1 through NCn may refer to cells programmed during a program operation. Alternatively, the normal cells NC1 through NCn may refer to memory cells in which data is stored or retrieved. The used line 170 according to embodiments of the present disclosure may include, for example, a plurality of word lines WL1 through WLn.

The unused line 180 may be connected to dummy cells. The dummy cells may have the same structure as the normal cells NC1 through NCn. However, a program operation and a read operation are not performed on the dummy cells. In other words, the dummy cells may refer to memory cells in which data is not stored or retrieved. For example, the dummy cells are not used for data storage and are not read. During the read operation, the dummy cells are applied with the same voltage as that for the unselected memory cells.

The unused line 180 according to embodiments of the present disclosure may include, for example, a ground select line GSL, a string select line SSL, and/or dummy word lines DWL1 and DWL2. Each dummy cell connected to the ground select line GSL may include a ground select transistor GST, and each dummy cell connected to the string select line SSL may include a string select transistor SST.

The dummy word lines DWL1 and DWL2 may be disposed at edges of a group of the word lines WL1 through WLn to protect the normal cells NC1 through NCn connected to the word lines WL1 through WLn. The dummy word lines DWL1 and DWL2 may, for example, be disposed between the ground select line GSL and the word line WL1 to reduce the effect of a potential difference between the normal cells NC1 through NCn and the common source line CSL and may be disposed between the string select line SSL and the word line WLn to reduce the effect of a potential difference between the normal cells NC1 through NCn and bit lines BL1 through BLm.

Although the first dummy word line DWL1 and the second dummy word line DWL2 are disposed between the ground select line GSL and the word line WL1 and between the string select line SSL and the word line WLn in FIG. 2, the present disclosure is not limited thereto. For example, the first dummy word line DWL1 and the second dummy word line DWL2 may also be disposed at only one of the above positions or may be disposed between the word lines WL1 through WLn. In addition, although the first and second dummy word lines DWL1 and DWL2 are illustrated in FIG. 2, the present disclosure is not limited thereto. The memory block BLK1 may also include a larger number of dummy word lines.

The memory block BLK1 may include a plurality of cell strings STR1 through STRm disposed between the bit lines BL1 through BLm and the common source line CSL. Each cell string (e.g., STR1) may include the ground select transistor GST, dummy cells DC1 and DC2, the normal cells NC1 through NCn, and the string select transistor SST.

The ground select transistor GST may have a source connected to the common source line CSL and a gate connected to the ground select line GSL. The string select transistor SST may have a drain connected to one of the bit lines BL1 through BLm and a gate connected to the string select line SSL. The first dummy cell DC1, the normal cells NC1 through NCn, and the second dummy cell DC2 may be connected in series between a source of the string select transistor SST and a drain of the ground select transistor GST.

Figure 3:
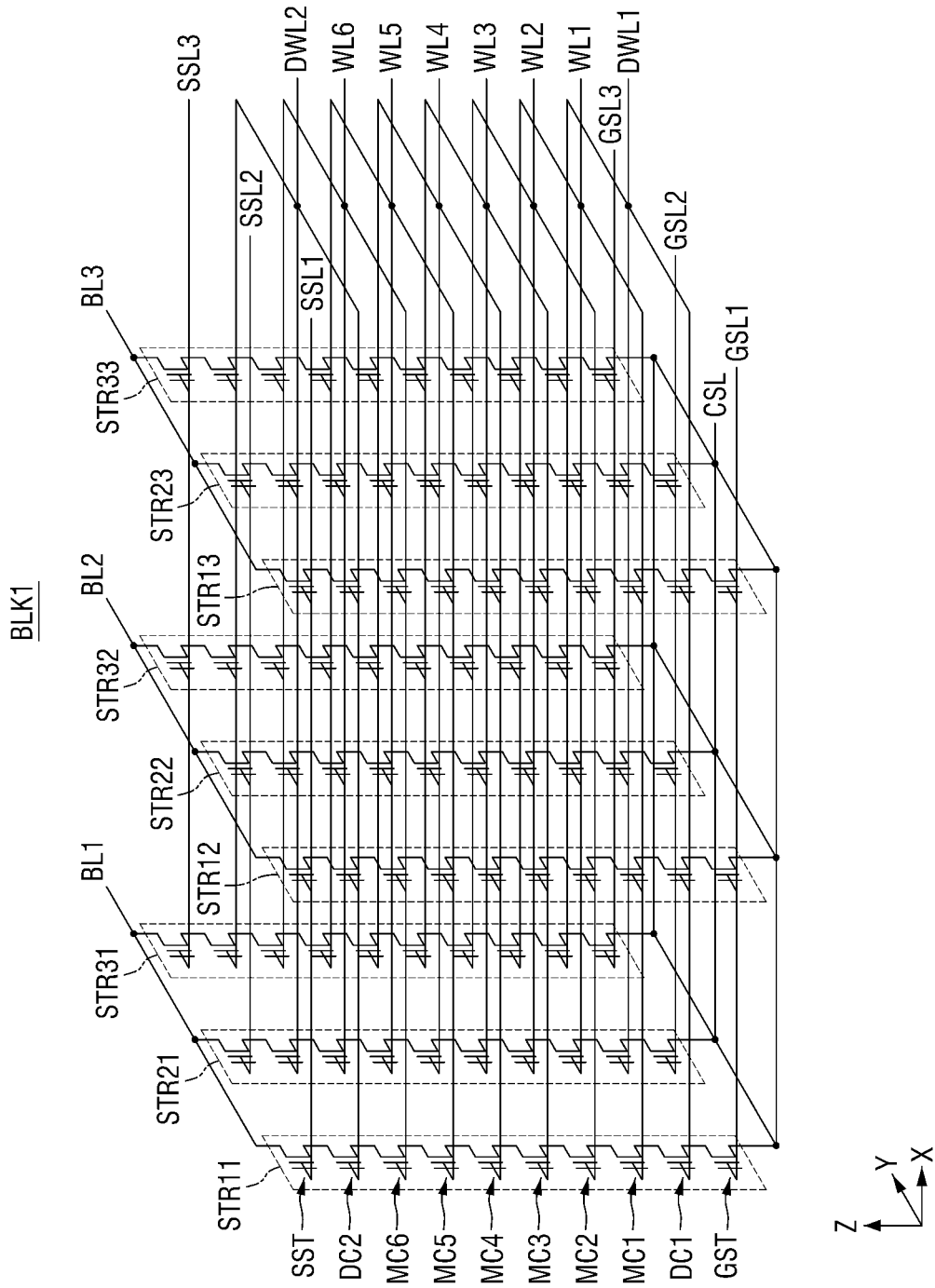
FIG. 3 is an example circuit diagram of the memory block of FIG. 1.

FIG. 3 is example circuit diagram of the memory block BLK1 of FIG. 1.

Referring to FIG. 3, when the memory cell array 160 (see FIG. 1) is a three-dimensional memory cell array, each of the memory blocks BLK1 through BLKa may include a plurality of three-dimensional strings STR11 through STR33 arranged on a substrate along a first direction X and a second direction Y different from the first direction X and arranged in a third direction Z perpendicular to a plane formed by the first direction X and the second direction Y.

The strings STR11 through STR33 may have the same structure as the strings STR1 through STRm of FIG. 2, respectively. A first dummy word line DWL1 may be disposed between a ground select line GSL and a first word line WL1, and a second dummy word line DWL2 may be disposed between a string select line SSL and a sixth word line WL6. The string select line SSL may be divided into first through third string select lines SSL1 through SSL3. Ground select transistors GST may be connected to ground select lines GSL1 through GSL3. In some embodiments, the ground select lines GSL1 through GSL3 may be connected to each other. String select transistors SST may be connected to bit lines BL1 through BL3, and the ground select transistors GST may be connected to a common source line CSL.

Here, the numbers of the cell strings STR11 through STR33, the word lines WL1 through WL6, the dummy word lines DWL1 and DWL2, the bit lines BL1 through BL3, the ground select lines GSL1 through GSL3 and the string select lines SSL1 through SSL3 and the arrangement of the dummy word lines DWL1 and DWL2 may vary according to an embodiment.

Figure 4:
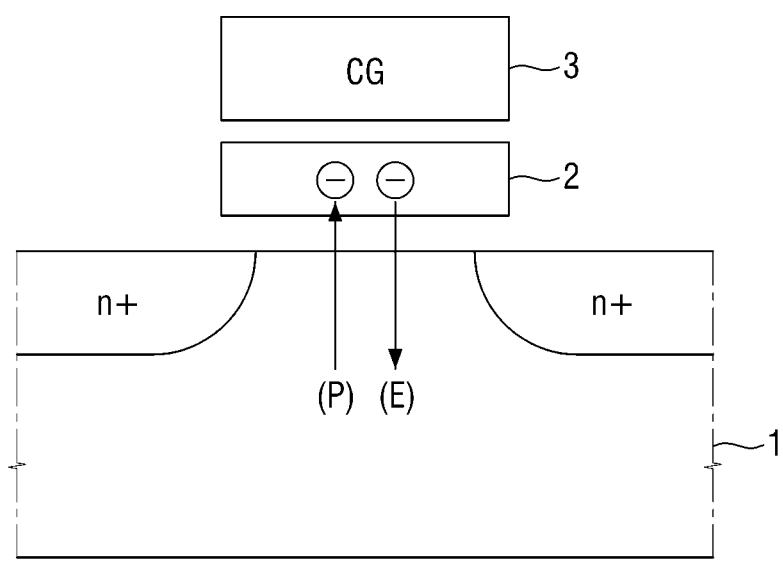
FIG. 4 illustrates a memory cell included in the memory block of FIGS. 2 and 3.

FIG. 4 illustrates a memory cell included in the memory block BLK1 of FIGS. 2 and 3. Here, the memory cell may be a normal cell and/or a dummy cell.

Referring to FIG. 4, the memory cell may include a channel region 1, a charge storage layer 2, and a control gate 3. In the case of a program operation on the memory cell, a relatively high program voltage may be applied to the control gate 3, and a relatively low voltage (e.g., 0 V) may be applied to the channel region 1. An electric field may be formed in a direction from the control gate 3 toward the channel region 1, and charges, for example, electrons may be transferred in a P direction from the channel region 1 to the charge storage layer 2. Therefore, the memory cell may be programmed.

In the case of an erase operation on the memory cell, a relatively low erase voltage (e.g., 0 V) may be applied to the control gate 3, and a relatively high voltage may be applied to the channel region 1. An electric field may be formed in a direction from the channel region 1 toward the control gate 3, and charges, for example, electrons may be transferred in an E direction from the charge storage layer 2 to the channel region 1. Therefore, the memory cell may be erased.

Figure 5:
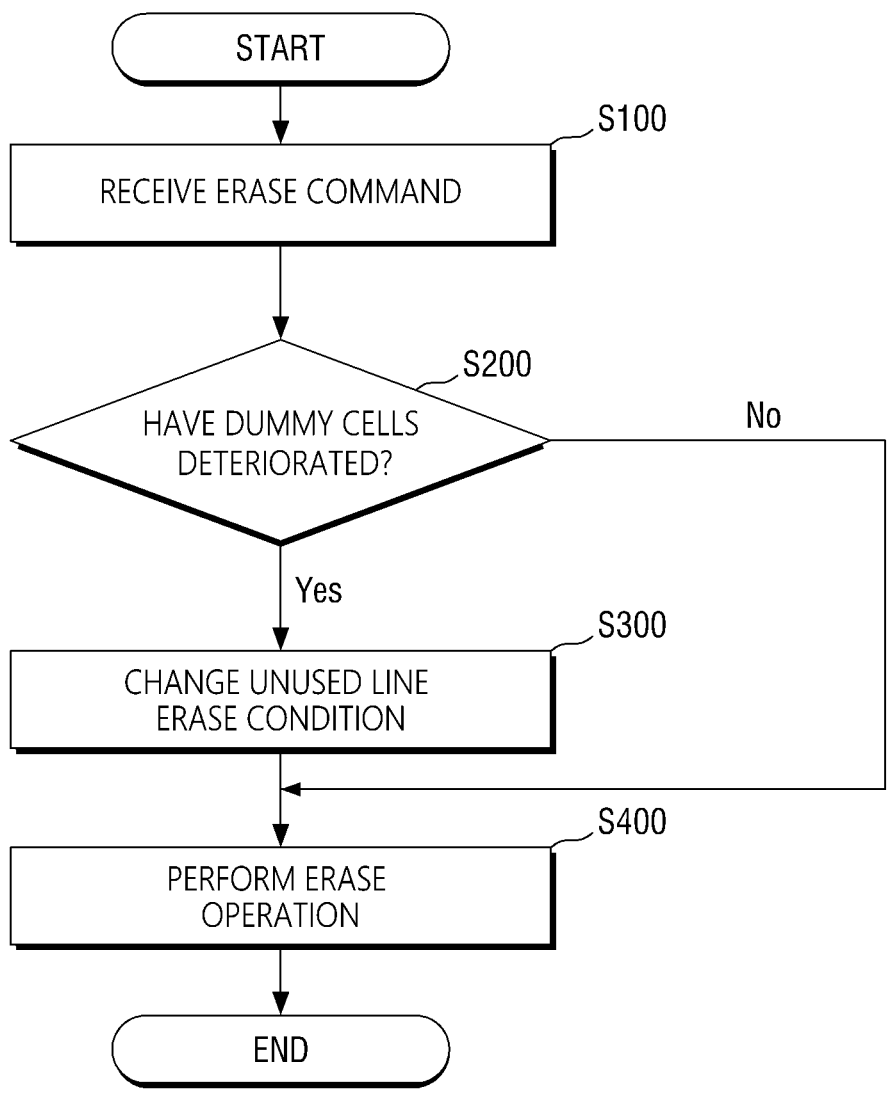
FIG. 5 is a flowchart illustrating a method of operating a nonvolatile memory device according to embodiments of the present disclosure.
Figure 6:
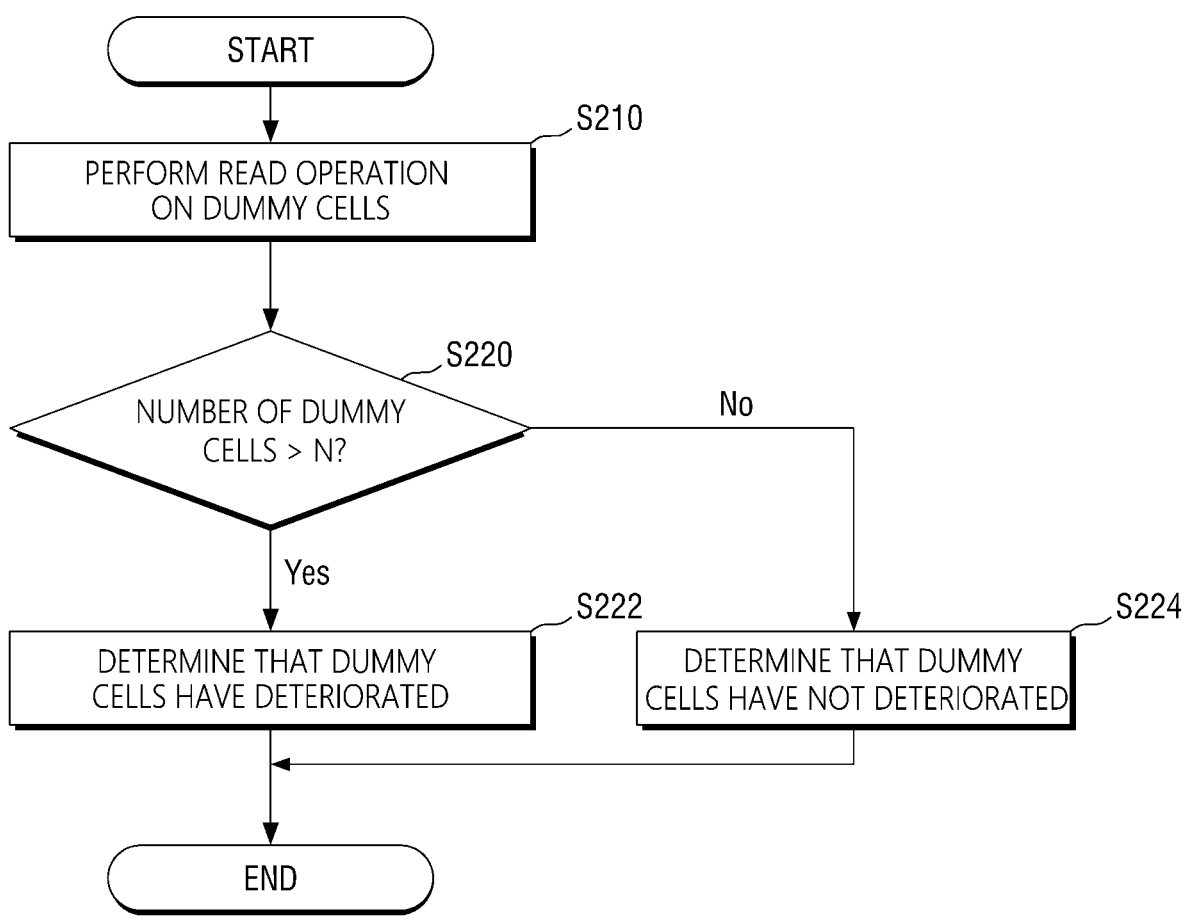
FIG. 6 is a flowchart illustrating a method of determining whether dummy cells have deteriorated.
Figure 7:
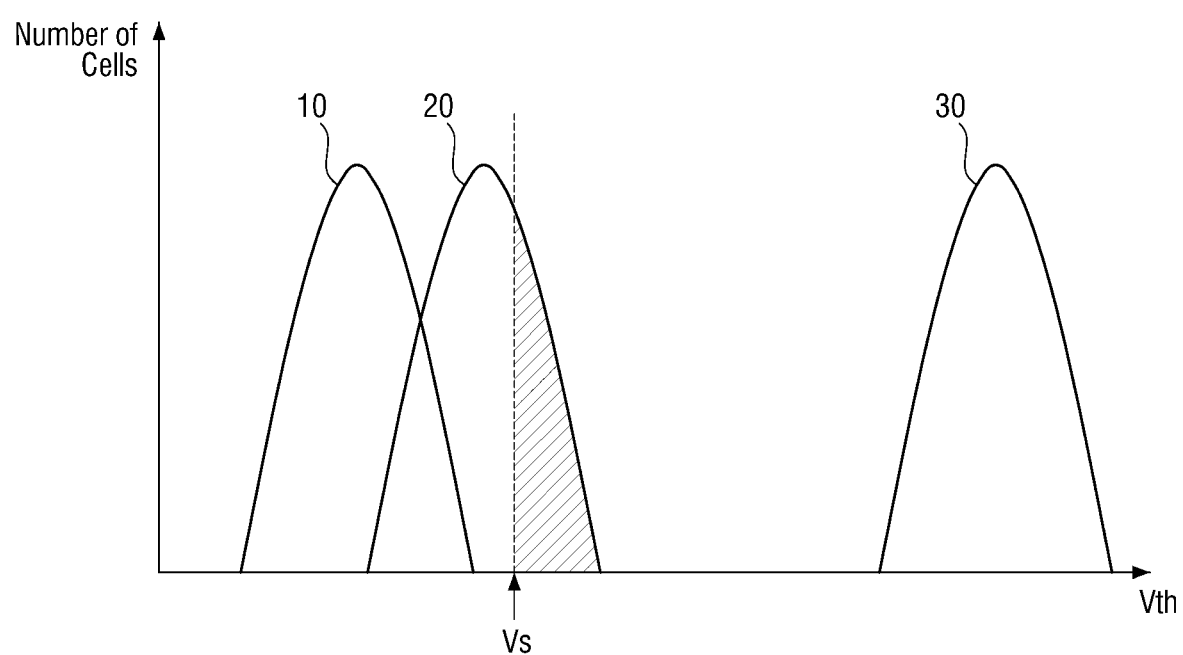
FIG. 7 illustrates a change in the threshold voltage distribution of dummy cells.

FIG. 5 is a flowchart illustrating a method of operating a nonvolatile memory device according to embodiments of the present disclosure. FIG. 6 is a flowchart illustrating operation S200 of FIG. 5. FIG. 7 illustrates a change in the threshold voltage distribution of dummy cells.

Referring to FIG. 5, the nonvolatile memory device may receive an erase command (operation S100). The erase command may be received from, for example, a host.

The nonvolatile memory device may determine, in response to the erase command, whether dummy cells have deteriorated (operation S200).

Referring to FIG. 6, the determining of whether the dummy cells have deteriorated (operation S200) may begin by performing a read operation on the dummy cells (operation S210). The read operation may be performed on the dummy cells to detect the threshold voltage distribution of the dummy cells using a reference threshold voltage Vs. Here, the dummy cells may refer to cells not programmed during a program operation, cells prohibited from being programmed, or memory cells in which data is not stored as described above. In an example embodiment, the detecting of the threshold voltage distribution may be performed by applying the reference threshold voltage Vs to the unused line in a read operation and counting the number of dummy cells which are turned on in the read operation.

As a result of reading the dummy cells, it may be determined whether the number of dummy cells whose threshold voltages are equal to or higher than the reference threshold voltage Vs is greater than a first predetermined number N (operation S220).

Referring to FIG. 7, since dummy cells are disposed adjacent to normal cells, they may be affected and degraded as an operation such as a program, read or ease operation is performed on the normal cells. For example, when the normal cells are programmed, the dummy cells are repeatedly erased and a significant amount of positive charges may accumulate at the floating gate of the dummy cells, which causes threshold voltages of the dummy cells to gradually change from a first distribution (i.e., a first threshold voltage distribution) 10 to a second distribution (i.e., a second threshold voltage distribution) 20. Such change in the threshold voltage distribution of the dummy cells may influence a cell current while performing a read operation, a program operation, a program verification operation and an erase operation on the normal cells, and as a result, programming and erasing characteristics of the normal cells may be degraded. Therefore, the threshold voltages of some dummy cells may be higher than the reference threshold voltage Vs, and the number of cells turned on may gradually increase.

In addition, the threshold voltages of the dummy cells may gradually increase to such an extent that the threshold voltage distribution of the dummy cells is changed from the first distribution 10 to a third distribution 30. Therefore, the threshold voltages of all dummy cells may be higher than the reference threshold voltage Vs. In this case, the dummy cells does not operate normally.

Referring again to FIG. 6, if the number of dummy cells whose threshold voltages are equal to or higher than the reference threshold voltage Vs is greater than the first predetermined number N, it may be determined that the dummy cells have deteriorated (operation S222). If it is determined that the dummy cells have deteriorated, an unused line erase condition may be changed (operation S300), and an unused line erase voltage may be applied to the unused line to perform an erase operation according to the erase command (operation S400).

The unused line erase voltage may be a voltage transiting from a first voltage to a floating voltage at a first time. The changing of the unused line erase condition may include changing the magnitude of the first voltage and/or the first time. That is, the erase operation may be performed on the dummy cells by applying the changed unused line erase voltage to the unused line. The erase operation may move the threshold voltage distribution of the dummy cells from the second distribution 20 to the first distribution 10.

Therefore, since the nonvolatile memory device according to the embodiments of the present disclosure performs the erase operation after determining, in response to the erase command, whether the unused line has deteriorated, it may detect and recover the deterioration of the unused line in advance and improve reliability. This will be described in detail later with reference to FIGS. 9 through 11.

On the other hand, if the number of dummy cells whose threshold voltages are equal to or higher than the reference threshold voltage Vs is not greater than the first predetermined number N, it may be determined that the dummy cells have not deteriorated (operation S224). If it is determined that the dummy cells have not deteriorated, the unused line erase condition is not changed, and the unused line erase voltage may be applied to the unused line to perform the erase operation according to the erase command (operation S400). The unused line erase voltage may be a voltage transiting from the first voltage to the floating voltage at the first time. This will be described below with reference to FIG. 8.

Figure 8:
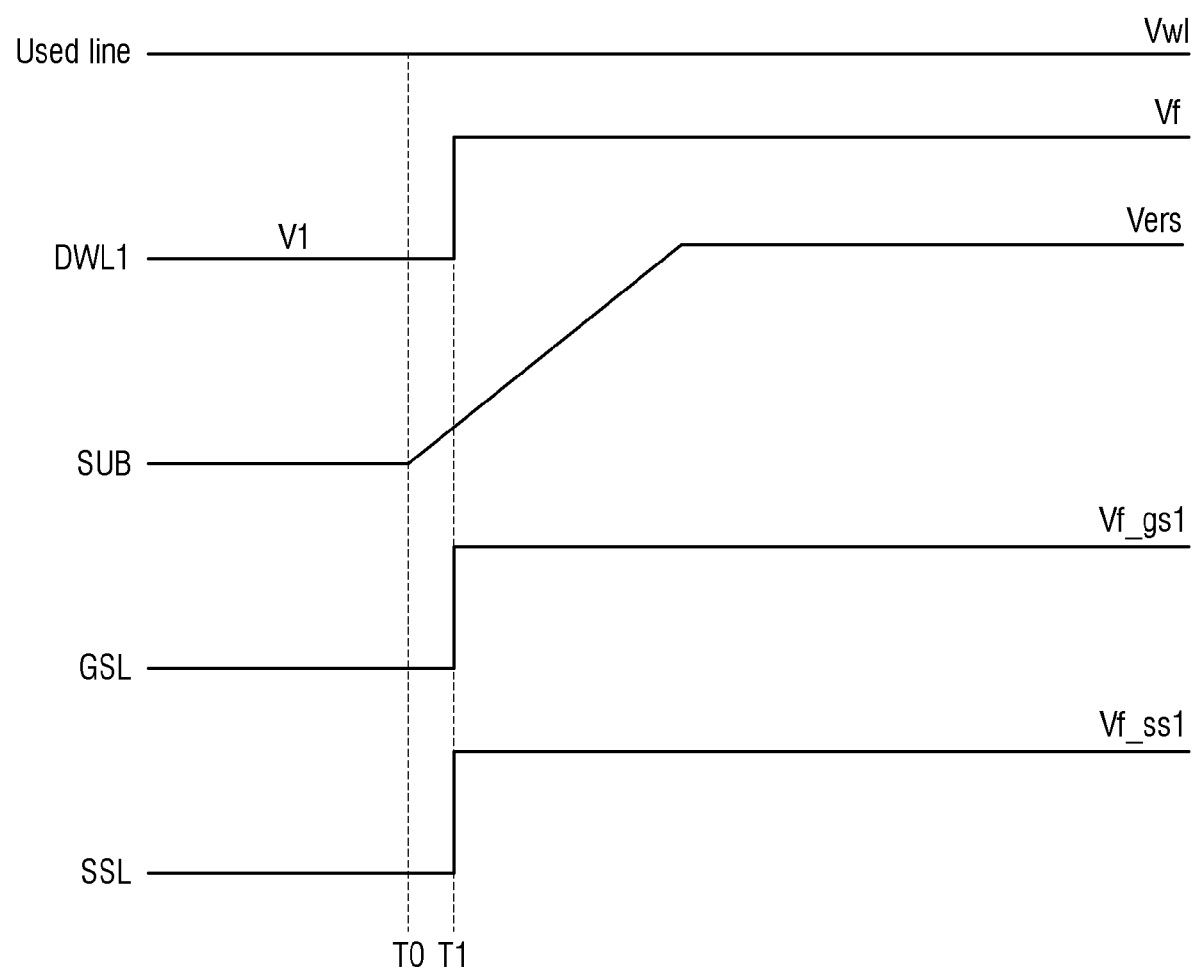
FIG. 8 is a voltage timing diagram for explaining the method of operating a nonvolatile memory device according to the embodiments of the present disclosure.
Figure 9:
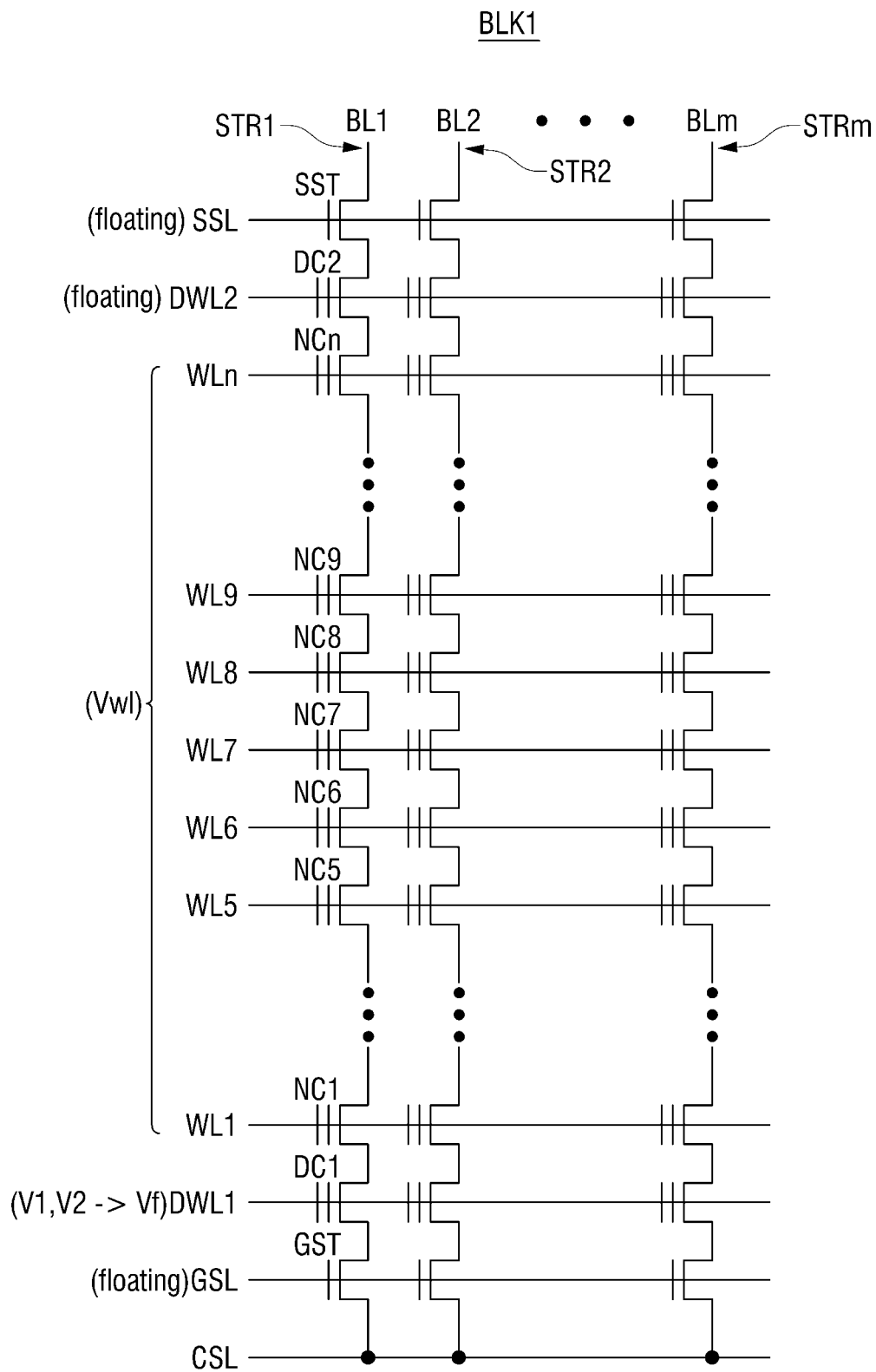
FIG. 9 is a diagram for explaining the method of operating a nonvolatile memory device according to the embodiments of the present disclosure.
Figure 10:
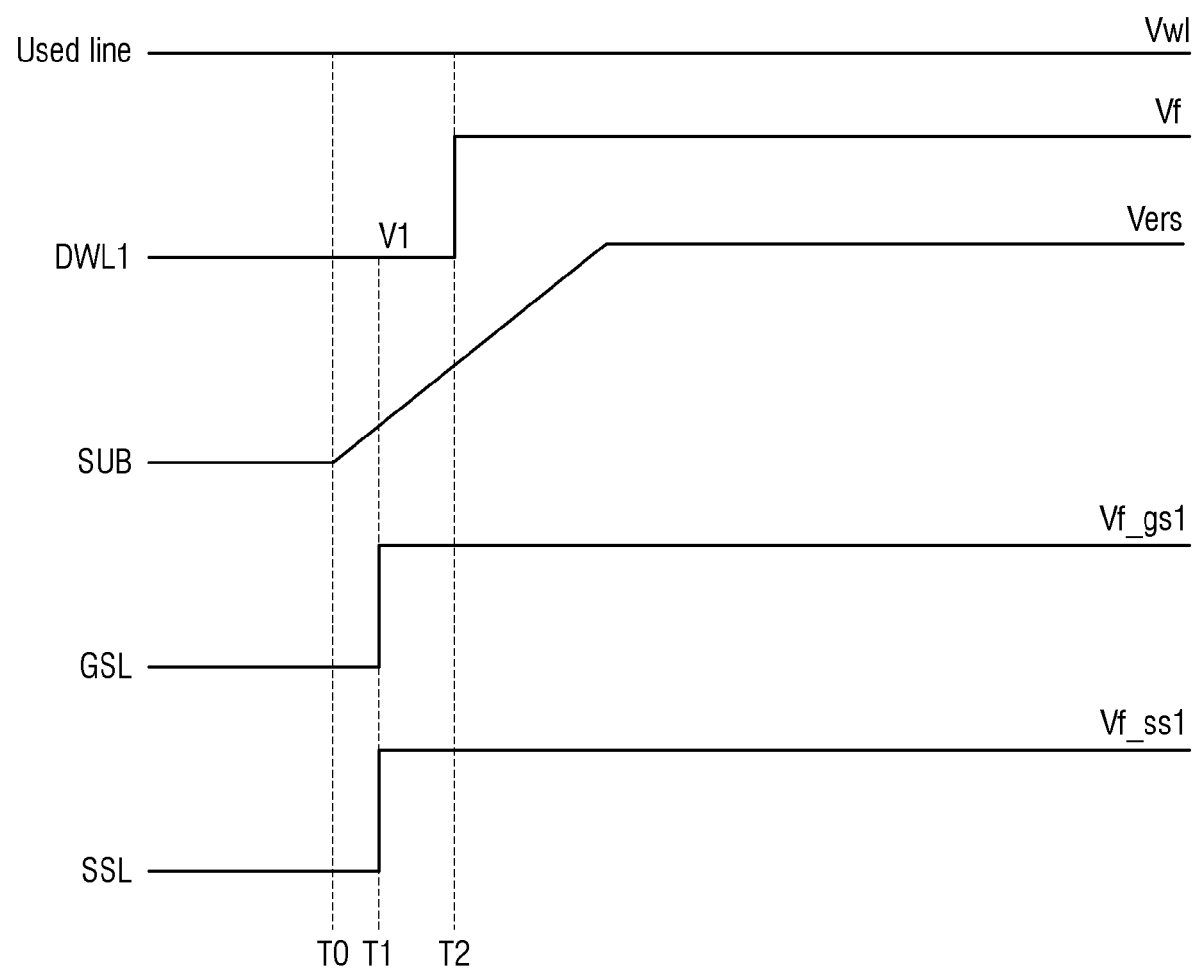
FIG. 10 is a voltage diagram for explaining the method of operating a nonvolatile memory device according to the embodiments of the present disclosure.
Figure 11:
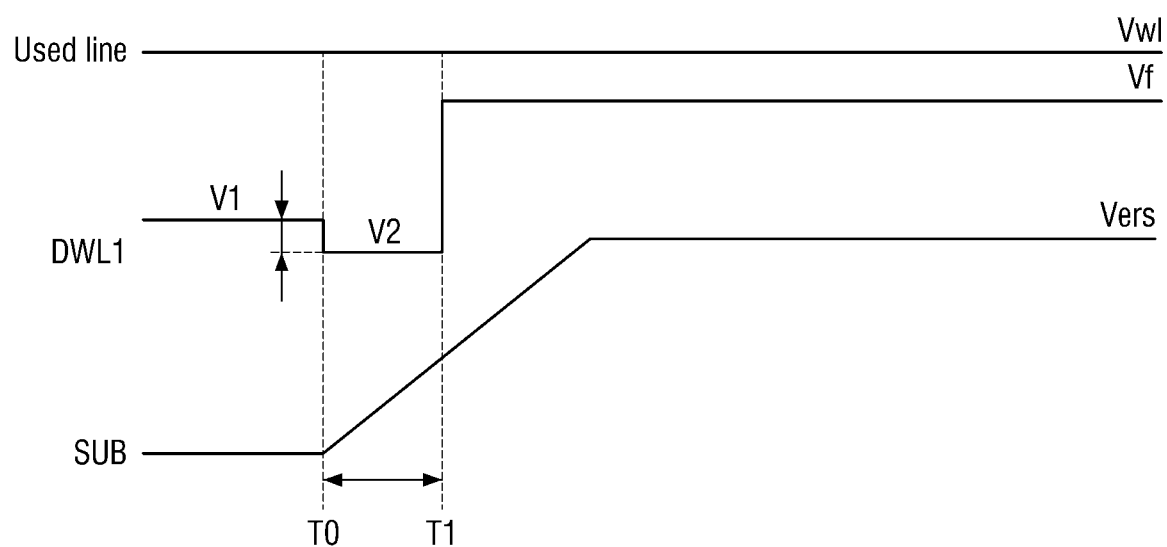
FIG. 11 is a voltage timing diagram for explaining a method of operating a nonvolatile memory device according to embodiments of the present disclosure.

FIGS. 8 and 10 are voltage timing diagrams for explaining the method of operating a nonvolatile memory device according to the embodiments of the present disclosure. FIG. 9 is a diagram for explaining the method of operating a nonvolatile memory device according to the embodiments of the present disclosure. FIG. 11 is a voltage timing diagram for explaining a method of operating a nonvolatile memory device according to embodiments of the present disclosure.

In the following description, it will be assumed that first dummy cells DC1 connected to a first dummy word line DWL1 have deteriorated and that an unused line indicates the first dummy word line DWL1. The present operating method is also applicable when ground select transistors GST connected to a ground select line GSL, second dummy cells DC2 connected to a second dummy word line DWL2, and/or string select transistors SST connected to a string select line SSL have deteriorated. The unused line may also be the ground select line GSL, the second dummy word line DWL2, and/or the string select line SSL to which dummy cells, which are not programmed during a program operation and are not read in a read operation, are connected.

Figure 12:
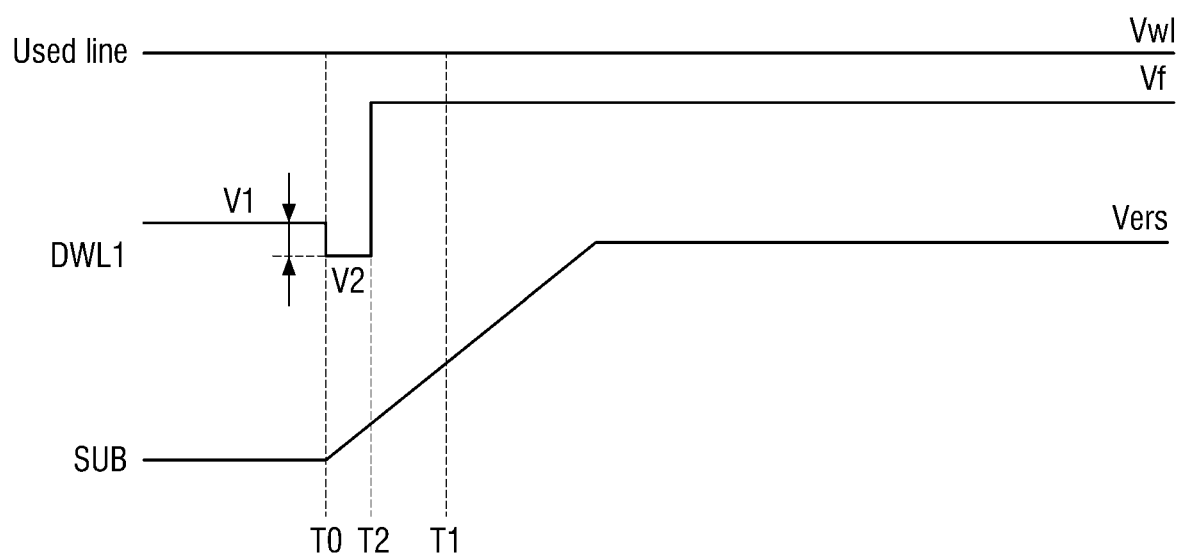
FIG. 12 is a voltage timing diagram for explaining a method of operating a nonvolatile memory device according to embodiments of the present disclosure.

FIG. 8 is a voltage timing diagram for explaining operation S300 of FIG. 5. FIG. 8 illustrates a case where the unused line erase condition is not changed because it is determined in operation S200 of FIG. 5 that dummy cells have not deteriorated. FIG. 9 illustrates a case where the unused line erase condition is changed in operation S300 because it is determined in operation S200 of FIG. 5 that the dummy cells have deteriorated. FIGS. 10 through 12 are voltage timing diagrams for explaining FIG. 9.

Referring to FIG. 8, in an erase operation, an erase voltage Vers may be applied to a substrate SUB at a reference time T0, and a word line erase voltage Vwl may be applied to used lines. Therefore, the erase operation may be performed on the used lines with a voltage difference between the erase voltage Vers and the word line erase voltage Vwl.

An unused line erase voltage may be applied to the unused line. The unused line erase voltage may transit from a first voltage V1 to a floating voltage Vf at a first time (i.e., a first time point) T1. Here, a difference between the first time T1 and the reference time (i.e., a reference time point) T0 may be small such that an erase operation is not performed on the dummy cells connected to the unused line. Therefore, the dummy cells connected to the unused line may be prevented from being erased.

Referring to FIG. 9, if it is determined that the dummy cells connected to the first dummy word line DWL1 have deteriorated, the unused line erase condition may be changed, and the unused line erase voltage transiting from the first voltage V1 or a second voltage V2 to the floating voltage Vf may be applied to the first dummy word line DWL1. A corresponding floating voltage may be applied to each of the ground select line GSL, the second dummy word line DWL2 and the string select line SSL to put it in a floating state. The word line erase voltage Vwl may be applied to used lines WL1 through WLn. For example, the deterioration determination is checked separately on each of the dummy word lines. And the controller 150 may respectively control voltages to be applied to the dummy word lines.

Referring to FIGS. 9 and 10, at the reference time T0, the erase voltage Vers may be applied to the substrate SUB, the word line erase voltage Vwl may be applied to the used lines, and the unused line erase voltage may be applied to the first dummy word line DWL1. The changing of the unused line erase condition may include changing the first time T1.

The first time T1 may be changed to a second time (i.e., a second time point) T2 which is later than the first time T1. That is, the unused line erase voltage may transit from the first voltage V1 to the floating voltage Vf at the second time T2. For example, the first time T1 may fall into a time section in which a voltage of a memory block BLK1 increases to the erase voltage Vers as the erase voltage Vers is applied to the substrate SUB. Alternatively, the first time T1 may be a time after the voltage of the memory block BLK1 reaches the erase voltage Vers.

The erase voltage Vers applied to the substrate SUB may be supplied to vertical channels. The ground select line GSL operates as a gate (or control gate) of the ground select transistor GST. The ground select line GSL undergoes coupling influence by a voltage change of the vertical channels. That is, as the erase voltage Vers applied to the vertical channels increases, a voltage of the ground select line GSL may increase. Thus, a voltage of the ground select line GSL increases to a floating voltage Vf_gsl of the ground select transistor GST and the ground select line GSL is floated. As a result, a voltage applied to the vertical channels may be the erase voltage Vers and the gate voltage of the ground select transistor GST may be the floating voltage Vf_gsl. A difference between the erase voltage Vers and the floating voltage Vf_gsl may not be great enough to induce a Fowler-Nordheim tunneling. Thus, the ground select transistor GST may be erase-prohibited.

The string select line SSL operates as a gate (or control gate) of the string select transistor SST. The string select line SSL undergoes coupling influence by a voltage change of the vertical channels. That is, as the erase voltage Vers applied to the vertical channels increases, a voltage of the string select line SSL may increase. Thus, the voltage of the string select line SSL may increase to a floating voltage Vf_ssl of the string select transistor SST. As a result, a voltage applied to the vertical channels may be the erase voltage Vers and the gate (or control gate) of the string select transistor SST may be the floating voltage Vf_ssl. A difference between the erase voltage Vers and the floating voltage Vf_ssl may not be great enough to induce a Fowler-Nordheim tunneling. Thus, the string select transistor SST may be erase-prohibited.

The first voltage V1 may be, for example, smaller than the erase voltage Vers and smaller than the floating voltage Vf.

An erase operation may be performed on the dummy cells DC1 connected to the first dummy word line DWL1 between the first time T1 and the second time T2 with a voltage difference between the first voltage V1 and the erase voltage Vers. That is, the first voltage V1 may be considered as a short-term erase voltage that erases the dummy cells DC1 connected to the first dummy word line DWL1 between the first time T1 and the second time T2. Therefore, as illustrated in FIG. 7, the first dummy cells DC1 connected to the first dummy word line DWL1 may be erased, and thus the threshold voltage distribution of the first dummy cells DC1 may be changed from the second distribution 20 or the third distribution 30 to the first distribution 10.

That is, the nonvolatile memory device according to the embodiments of the present disclosure may detect the deterioration of the unused line DWL1 and perform an erase operation on the dummy cells DC1 connected to the unused line DWL1, thereby recovering the dummy cells DC1. Therefore, the reliability of the nonvolatile memory device may be increased.

Referring to FIGS. 9 and 11, at the reference time T0, the erase voltage Vers may be applied to the substrate SUB, the word line erase voltage Vwl may be applied to the used lines, and the unused line erase voltage may be applied to the first dummy word line DWL1. The changing of the unused line erase condition may include changing the first voltage V1.

The first voltage V1 may be changed to the second voltage V2 which is smaller than the first voltage V1. That is, the unused line erase voltage may transit from the second voltage V2 to the floating voltage Vf at the first time T1. A voltage difference between the second voltage V2 and the erase voltage Vers may be greater than the voltage difference between the first voltage V1 and the erase voltage Vers illustrated in FIG. 9.

Therefore, an erase operation may be performed on the first dummy cells DC1 with the voltage difference between the second voltage V2 and the erase voltage Vers. The second voltage V2 may be considered as a short-term erase voltage that erases the dummy cells DC1 connected to the first dummy word line DWL1 between the first time T1 and the second time T2. Therefore, as illustrated in FIG. 7, the first dummy cells DC1 connected to the first dummy word line DWL1 may be erased, and thus the threshold voltage distribution of the first dummy cells DC1 may be changed from the second distribution 20 or the third distribution 30 to the first distribution 10.

That is, the nonvolatile memory device according to the embodiments of the present disclosure may control an erase operation on the dummy cells DC1 connected to the unused line DWL1 by controlling the magnitude of the first voltage V1 of the unused line erase voltage or the first time T1 in the unused line erase voltage when transiting from the first voltage V1 to the floating voltage Vf at the first time T1. Therefore, the reliability of the nonvolatile memory device may be increased.

Referring to FIGS. 9 and 12, at the reference time T0, the erase voltage Vers may be applied to the substrate SUB, the word line erase voltage Vwl may be applied to the used lines, and the unused line erase voltage may be applied to the first dummy word line DWL1. The changing of the unused line erase condition may include changing the first voltage V1 and the first time T1.

The unused line erase voltage may transit from the second voltage V2 to the floating voltage Vf at the second time T2. The second voltage V2 may be smaller than the first voltage V1, and the second time T2 may be earlier than the first time T1. Therefore, an erase operation may be performed on the first dummy cells DC1 from the reference time T0 to the second time T2 with the voltage difference between the second voltage V2 and the erase voltage Vers.

Figure 13:
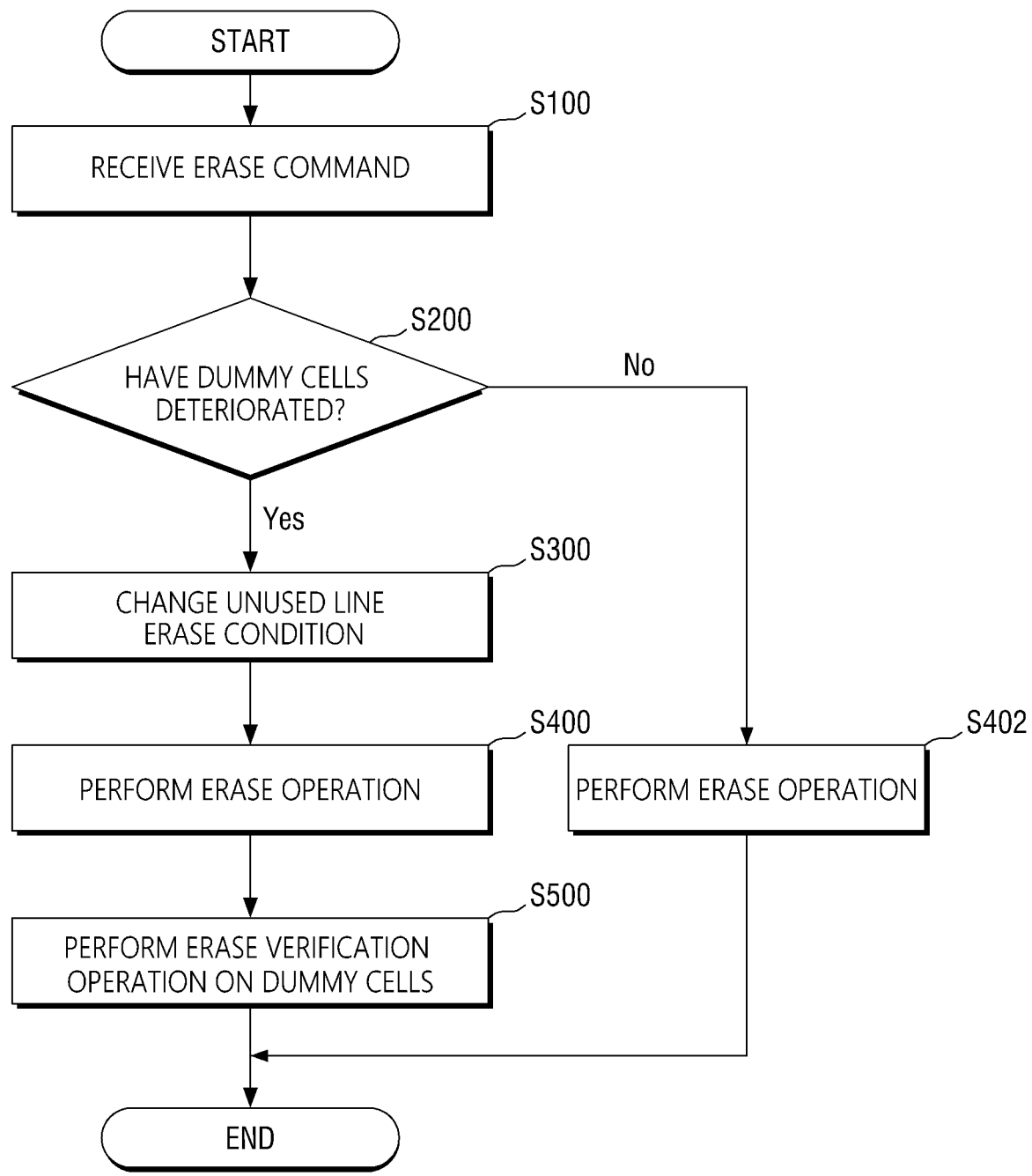
FIG. 13 is a flowchart illustrating a method of operating a nonvolatile memory device according to embodiments of the present disclosure.
Figure 14:
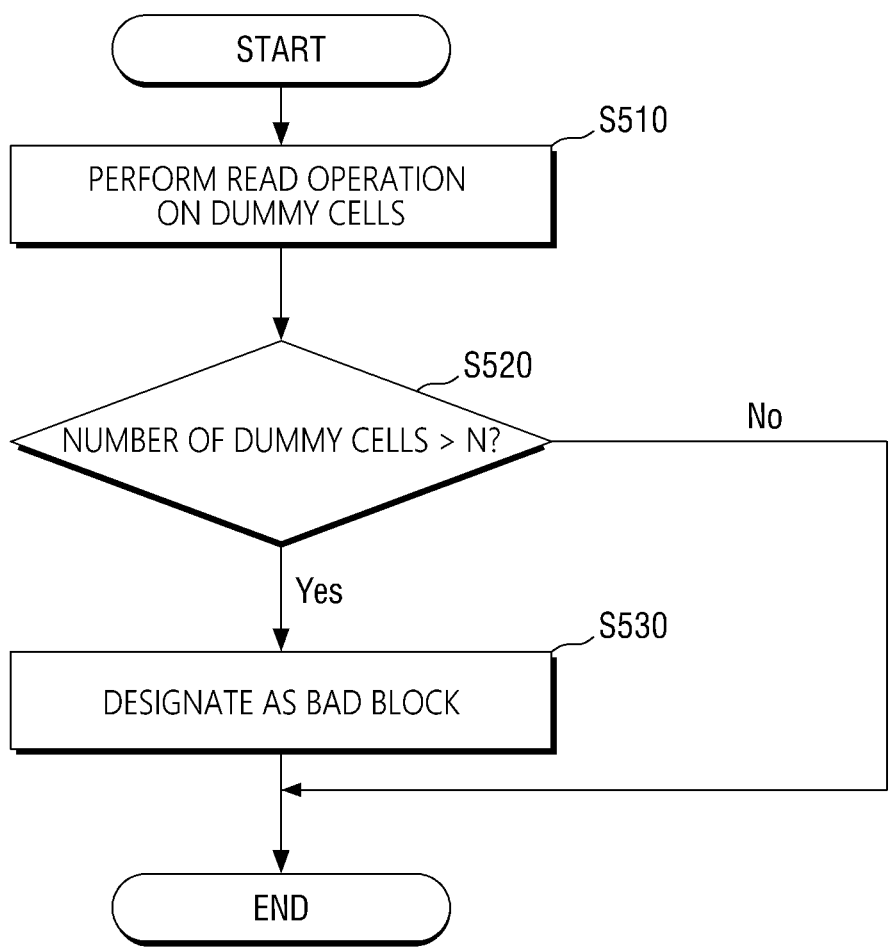
FIG. 14 is a flowchart illustrating an erase verification operation performed on dummy cells.
Figure 15:
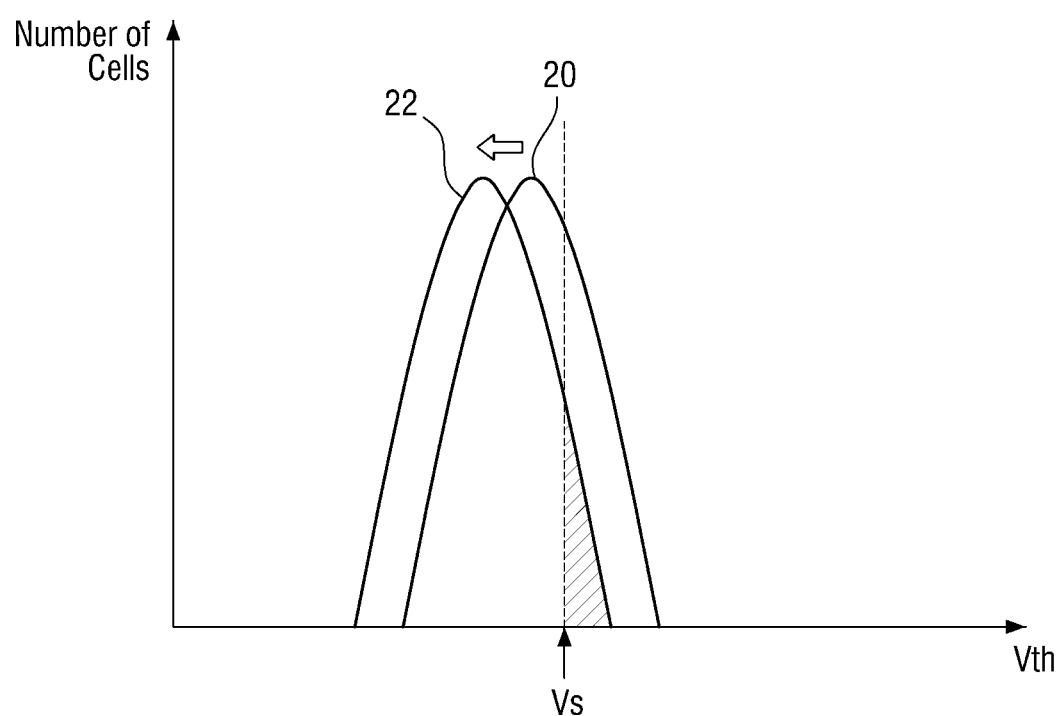
FIG. 15 illustrates a change in the threshold voltage distribution of dummy cells.

FIG. 13 is a flowchart illustrating a method of operating a nonvolatile memory device according to embodiments of the present disclosure. FIG. 14 is a flowchart illustrating operation S500 of FIG. 13. FIG. 15 illustrates a change in the threshold voltage distribution of dummy cells.

Referring to FIG. 13, the method of operating a nonvolatile memory device according to the embodiments of the present disclosure may further include performing an erase verify operation on dummy cells (operation S500) after performing an erase operation (operation S400). Here, the erase verify operation on the dummy cells may be performed (operation S500) when an unused line erase condition is changed (operation S300) after it is determined that the dummy cells have deteriorated (operation S200).

When the unused line erase condition is not changed because it is determined that the dummy cells have not deteriorated (operation S200), the erase verify operation is not performed on the dummy cells because the erase operation itself is not performed on the dummy cells, and an erase operation may be performed on a memory block (operation S402) and then completed.

Referring to FIG. 14, the performing of the erase verify operation on the dummy cells (operation S500) may begin by performing a read operation (operation S510). The read operation may be performed on the dummy cells to detect the threshold voltage distribution of the dummy cells using a reference threshold voltage Vs. Here, the dummy cells may refer to cells not programmed during a program operation, cells prohibited from being programmed, or memory cells in which data is not stored as described above. In an embodiment, the detecting of the threshold voltage distribution of the dummy cells may be performed by applying the reference threshold voltage Vs to unused line in the read operation and counting the number of dummy cells which are turned on in the read operation.

As a result of reading the dummy cells, it may be determined whether the number of dummy cells whose threshold voltages are equal to or higher than the reference threshold voltage Vs is greater than a second predetermined number N (operation S520). Here, the reference threshold voltage Vs may be the same as the reference threshold voltage Vs based on which deterioration of the dummy cells is determined. As illustrated in FIG. 15, an erase operation may be performed on the dummy cells, thereby changing the threshold voltage distribution from a second distribution 20 to a third distribution 22. However, the threshold voltage distribution of the dummy cells is not moved to a normal range (e.g., the first distribution 10 of FIG. 7). Therefore, threshold voltages of some dummy cells may be higher than the reference threshold voltage Vs, and the dummy cells do not operate normally.

Figure 16:
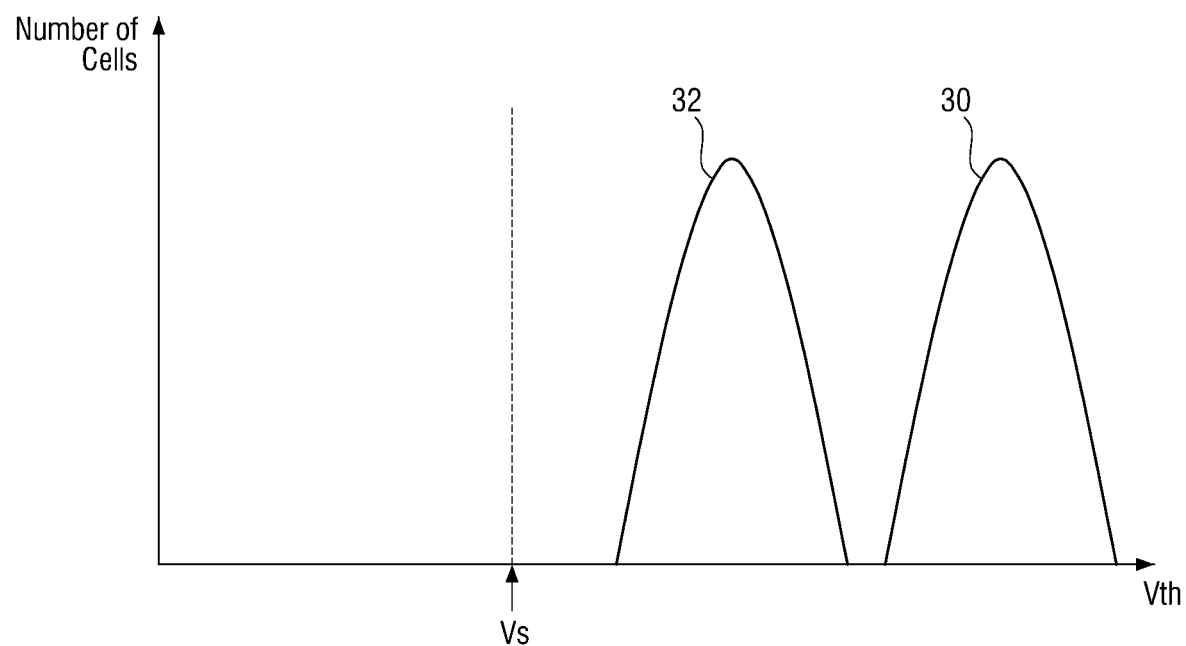
FIG. 16 illustrates a change in the threshold voltage distribution of dummy cells.

Alternatively, as illustrated in FIG. 16, an erase operation may be performed on the dummy cells, thereby changing the threshold voltage distribution from a third distribution 30 to a fourth distribution 32. However, threshold voltages of all dummy cells may be higher than the reference threshold voltage Vs. Therefore, the dummy cells do not operate normally.

Referring again to FIG. 14, if the number of dummy cells whose threshold voltages are equal to or higher than the reference threshold voltage Vs is greater than the second predetermined number N, an erase verification operation S500 may be terminated (i.e., aborted) and a corresponding memory block may be designated as a bad block because the dummy cells of the corresponding block have not been recovered (operation S530). For example, the memory block may be designated as a bad block and is not be used for a program operation.

On the other hand, if the number of dummy cells whose threshold voltages are equal to or higher than the reference threshold voltage Vs is not greater than the second predetermined number N, the erase verification operation may be completed. Therefore, since the nonvolatile memory device according to the embodiments of the present disclosure terminates (i.e., abort) the erase verification operation without repeating it until the distribution of the threshold voltages of the dummy cells falls within the normal range, the power consumption of the nonvolatile memory device may be prevented or reduced, and the speed of the erase operation may be increased.

Figure 17:
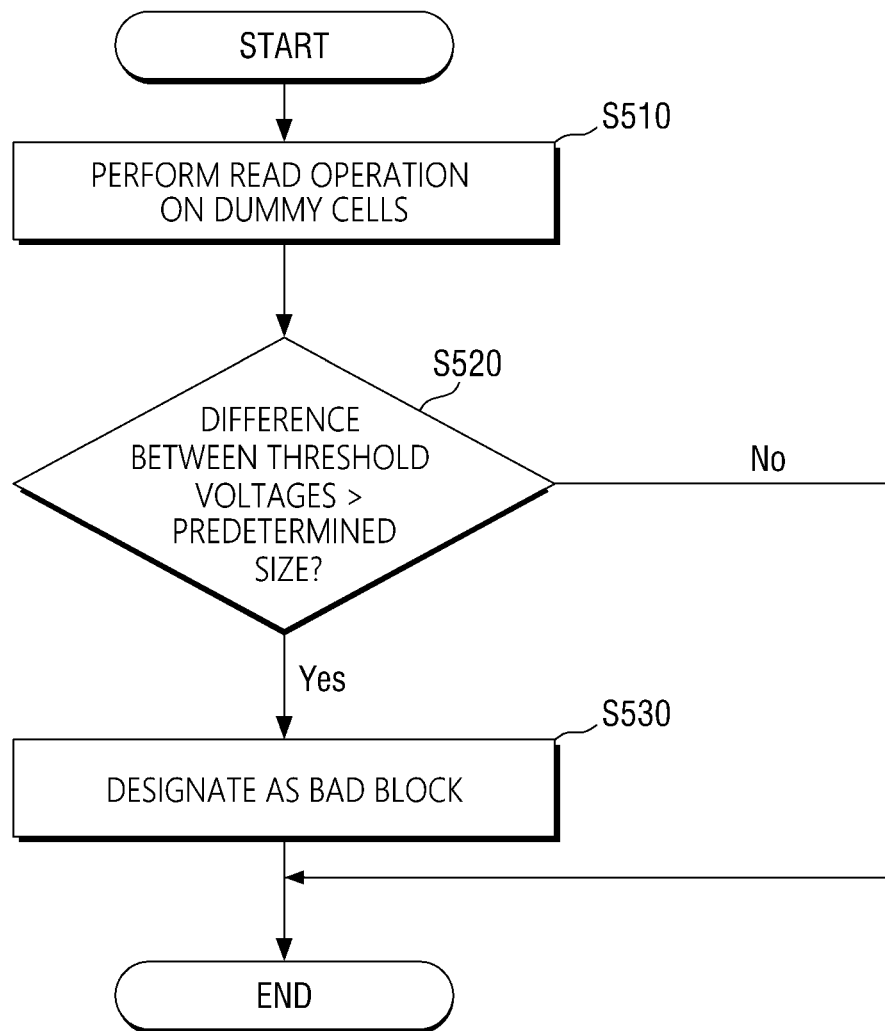
FIG. 17 is a flowchart illustrating an erase verification operation performed on dummy cells.
Figure 18:
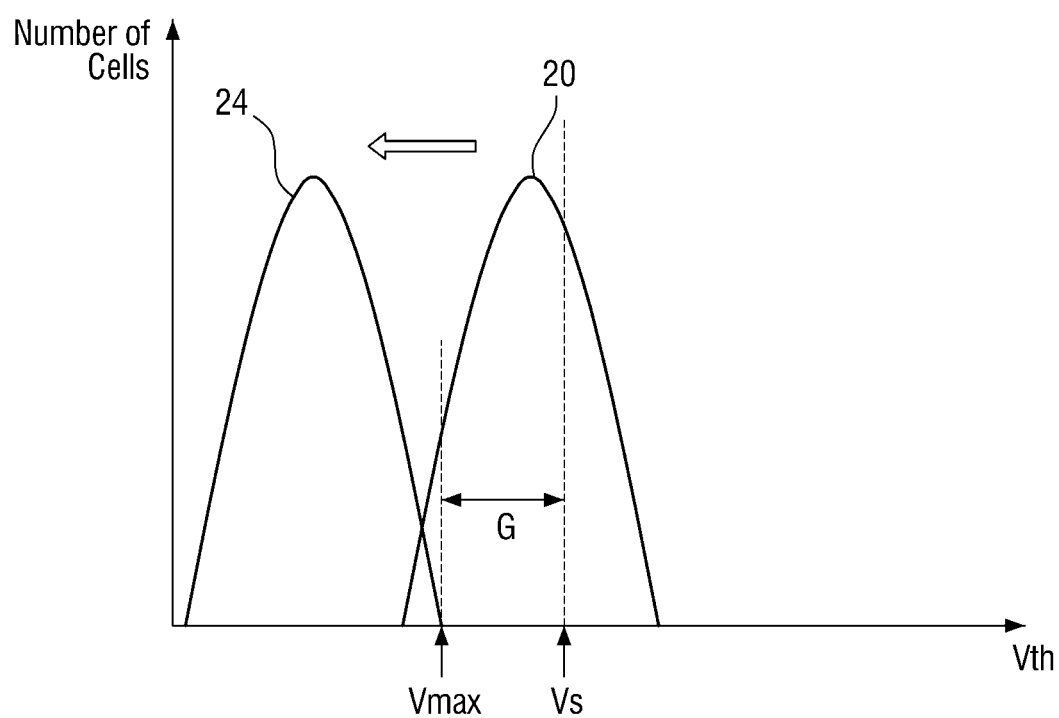
FIG. 18 illustrates a change in the threshold voltage distribution of dummy cells.

FIG. 17 is a flowchart illustrating operation S500 of FIG. 13 according to embodiments of the present disclosure. FIG. 18 illustrates a change in the threshold voltage distribution of dummy cells.

Referring to FIGS. 17 and 18, the performing of the erase verify operation on the dummy cells (operation S500) may begin by performing a read operation (operation S510).

As a result of reading the dummy cells, it may be determined whether a difference G between a reference threshold voltage Vs and a maximum threshold voltage Vmax of a threshold distribution of the dummy cells is greater than a predetermined size (operation S520). Here, the reference threshold voltage Vs may be the same as the reference threshold voltage Vs based on which deterioration of the dummy cells is determined.

As illustrated in FIG. 18, an erase operation may be performed on the dummy cells, thereby changing the threshold voltage distribution from a second distribution 20 to a fifth distribution 24. However, such excessive movement of the threshold voltage distribution of the dummy cells may reduce a sensing margin of the dummy cells. That is, even if the number of dummy cells whose threshold voltages are equal to or higher than the reference threshold voltage Vs is not greater than the second predetermined number, the dummy cells do not operate normally because they are excessively erased.

Referring again to FIG. 17, if the difference G between the reference threshold voltage Vs and the maximum threshold voltage Vmax of the dummy cells is greater than the predetermined size, an erase verification operation S500 may be aborted and a corresponding memory block may be designated as a bad block (operation S530). For example, the memory block may be designated as a bad block and is not used for a program operation.

On the other hand, if the difference G between the reference threshold voltage Vs and the maximum threshold voltage Vmax of the dummy cells is not greater than the predetermined size, the erase verification operation may be completed.

Figure 19:
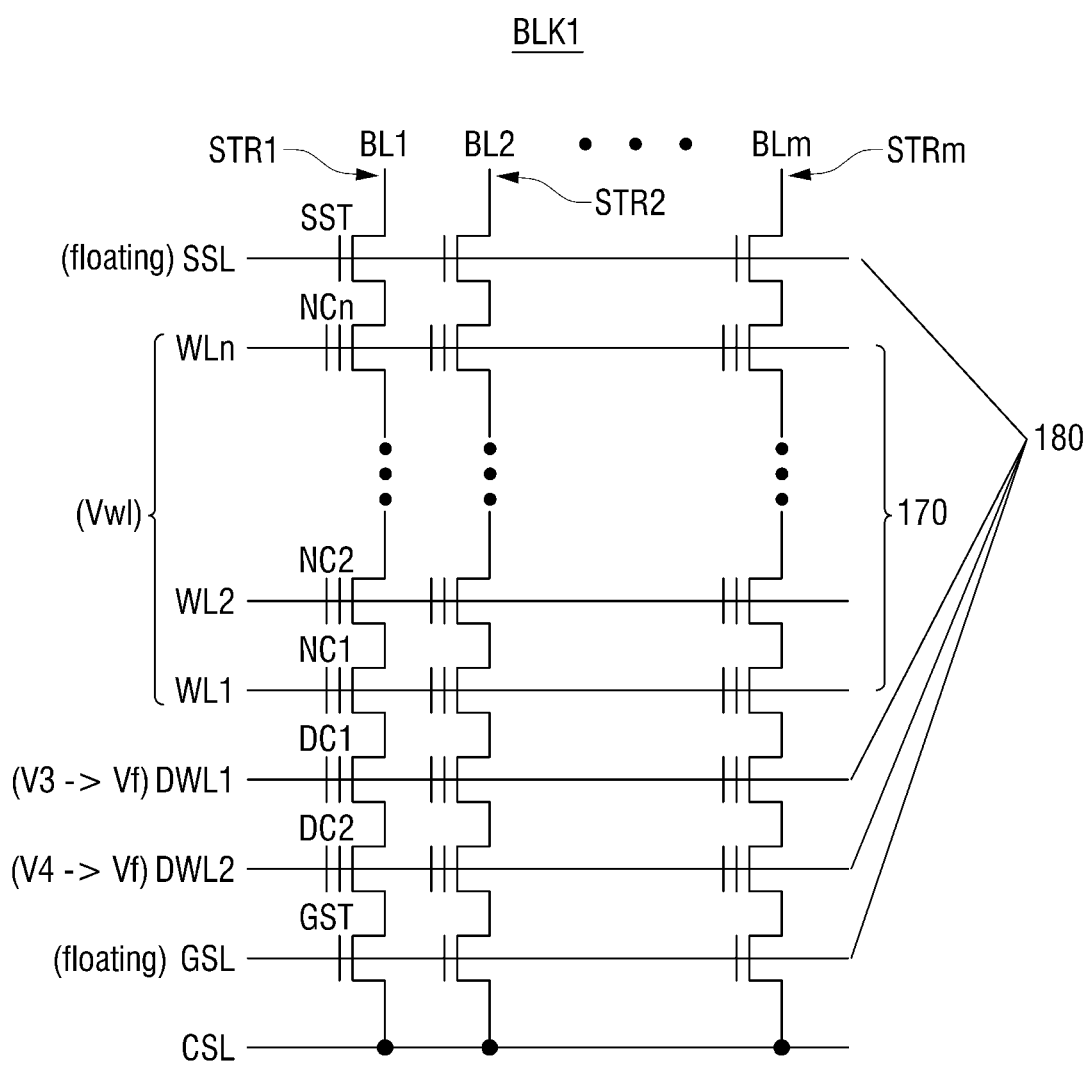
FIG. 19 is an example circuit diagram of a nonvolatile memory device according to embodiments of the present disclosure.
Figure 20:
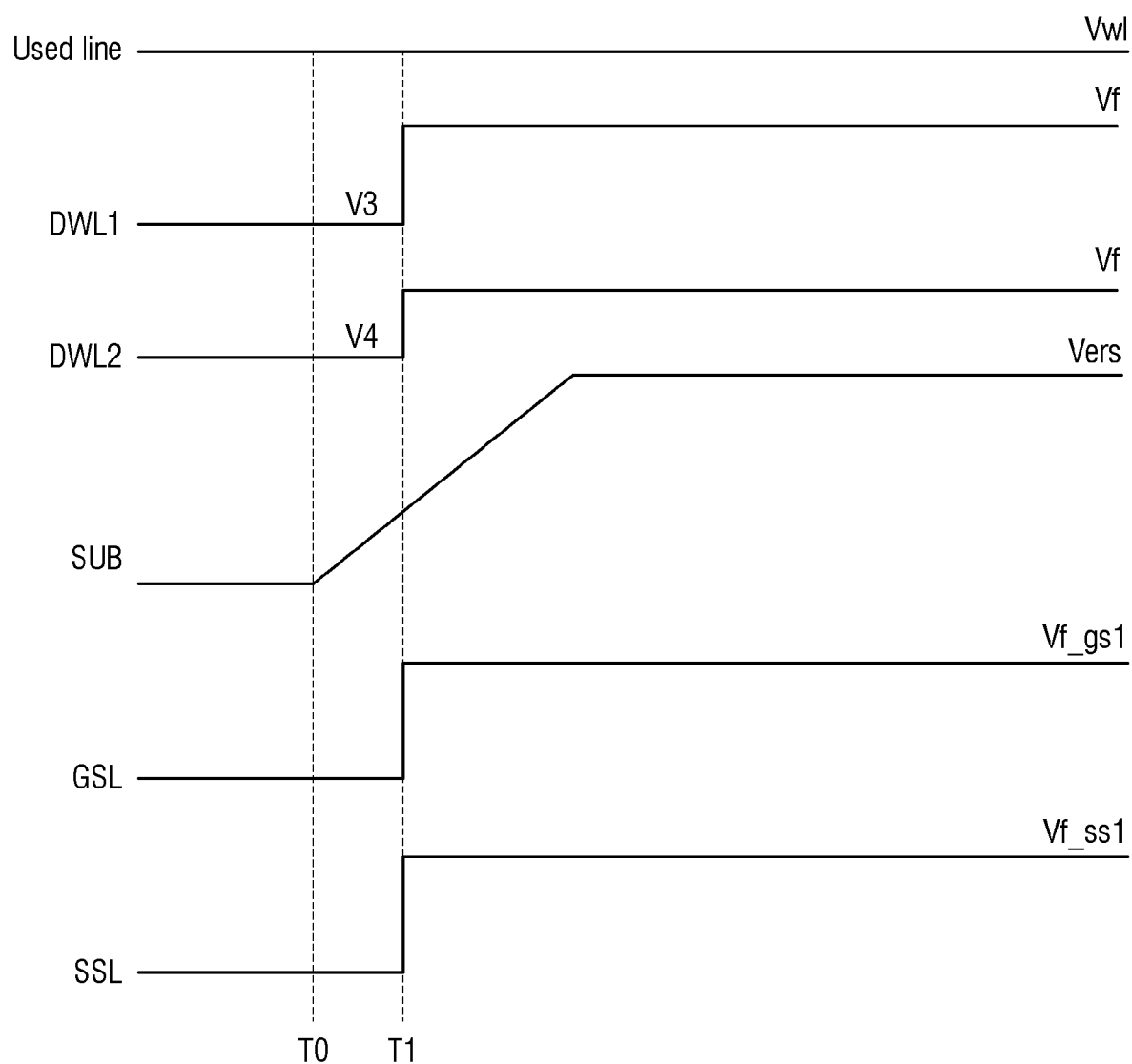
FIG. 20 is a voltage timing diagram for explaining a method of operating the nonvolatile memory device of FIG. 19.

FIG. 19 is an example circuit diagram of a nonvolatile memory device according to embodiments of the present disclosure. FIG. 20 is a voltage timing diagram for explaining a method of operating the nonvolatile memory device of FIG. 19.

Referring to FIG. 19, a memory block BLK1 of the nonvolatile memory device according to the embodiments of the present disclosure may include a used line 170, an unused line 180, and a common source line CSL.

The used line 170 may be connected to normal cells NC1 through NCn and may include a plurality of word lines WL1 through WLn.

The unused line 180 may be connected to dummy cells and may include a ground select line GSL, a string select line SSL, a first dummy word line DWL1 and a second dummy word line DWL2. Each dummy cell connected to the ground select line GSL may include a ground select transistor GST, and each dummy cell connected to the string select line SSL may include a string select transistor SST. First dummy cells DC1 may be connected to the first dummy word line DWL1, and second dummy cells DC2 may be connected to the second dummy word line DWL2.

The first dummy word line DWL1 and the second dummy word line DWL2 may be disposed between the ground source line GSL and the first word line WL1. The first dummy word line DWL1 may be disposed adjacent to the first word line WL1, and the second dummy word line DWL2 may be disposed farther from the first word line WL1. That is, the first dummy word line DWL1 may be disposed adjacent to the used line 170, and the second dummy word line DWL2 may be disposed farther from the used line 170.

A plurality of cell strings STR1 through STRm may be disposed between bit lines BL1 through BLm and the common source line CSL. Each cell string (e.g., STR1) may include the ground select transistor GST, the dummy cells DC1 and DC2, the normal cells NC1 through NCn, and the string select transistor SST.

The normal cells NC1 through NCn, the first dummy cell DC1 and the second dummy cell DC2 may be connected in series between a source of the string select transistor SST and a drain of the ground select transistor GST.

The ground select transistor GST may have a source connected to the common source line CSL, a gate connected to the ground select line GSL, and the drain connected to the second dummy cell DC2. The string select transistor SST may have a drain connected to one of the bit lines BL1 through BLm, a gate connected to the string select line SSL, and the source connected to the $n^{th}$ normal cell NCn.

When it is determined that the first dummy cells DC1 and the second dummy cells DC2 have deteriorated, an erase condition of the first dummy cells DC1 and the second dummy cells DC2 may be changed, and unused line erase voltages applied to the first dummy cells DC1 and the second dummy cells DC2 may be changed. For example, the magnitude of a first voltage V1 may be changed. A second unused line erase voltage transiting from a fourth voltage V4 to a floating voltage Vf may be applied to the second dummy word line DWL2. A corresponding floating voltage may be applied to each of the ground select line GSL and the string select line SSL to put it in a floating state.

Referring to FIG. 20, at a reference time T0, an erase voltage Vers may be applied to a substrate SUB, and a word line erase voltage Vwl may be applied to the used lines WL1 through WLn. Therefore, an erase operation may be performed on the used lines with a voltage difference between the erase voltage Vers and the word line erase voltage Vwl.

At the reference time T0, a first unused line erase voltage transiting from a third voltage V3 to the floating voltage Vf at a first time T1 may be applied to the first dummy word line DWL1, and the second unused line erase voltage transiting from the fourth voltage V4 to the floating voltage Vf at the first time T1 may be applied to the second dummy word line DWL2. The third voltage V3 and the fourth voltage V4 may respectively be applied to the first dummy word line DWL1 and the second dummy word line DWL2 from the reference time T0 to the first time T1. For example, the third voltage V3 may have the same magnitude as the first voltage V1 or may have a smaller magnitude than the first voltage V1.

Since the first dummy cells DC1 are disposed closer to the used line 170 than the second dummy cells DC2, they may be more affected by an operation such as a program, read or erase operation on the normal cells NC1 through NCn. For example, the first dummy cells DC1 may deteriorate more than the second dummy cells DC2. In other words, a threshold voltage distribution of the first dummy cells DC1 may be shifted more to higher threshold voltages than that of the second dummy cells DC2. Thus, an erase operation may have to be performed with greater voltage difference between gates of the dummy cells and the substrate on the first dummy cells DC1 than on the second dummy cells DC2.

For example, the third voltage V3 may be smaller than the fourth voltage V4. Thus, a voltage difference between the third voltage V3 and the erase voltage Vers may be greater than a voltage difference between the fourth voltage V4 and the erase voltage Vers. Thus, an erase operation may be performed with greater voltage difference between the gates of the first dummy cells DC1 and the substrate on the first dummy cells DC1 than voltage difference between the gates of the second dummy cells DC2 and the substrate on the second dummy cells DC2.

Figure 21:
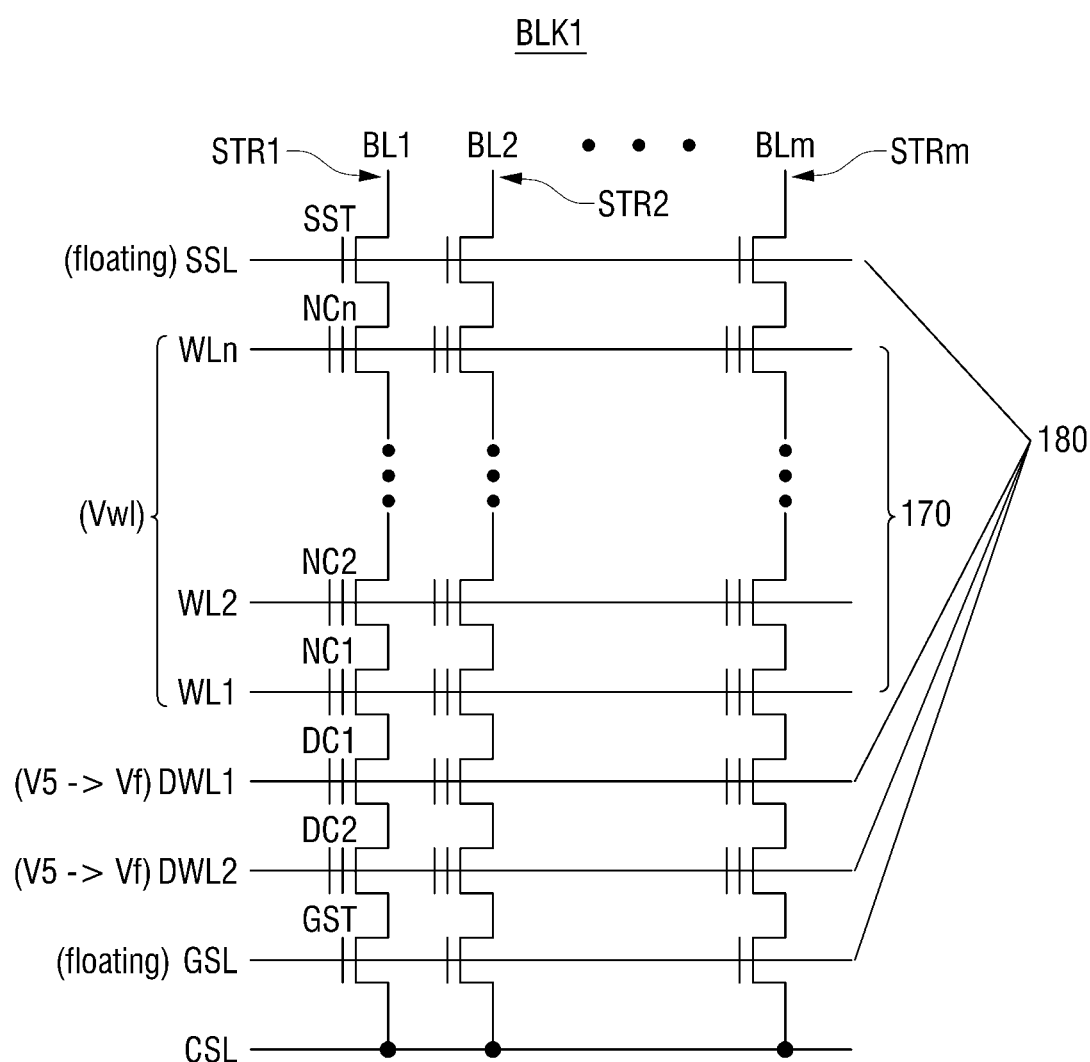
FIG. 21 is an example circuit diagram of a nonvolatile memory device according to embodiments of the present disclosure.
Figure 22:
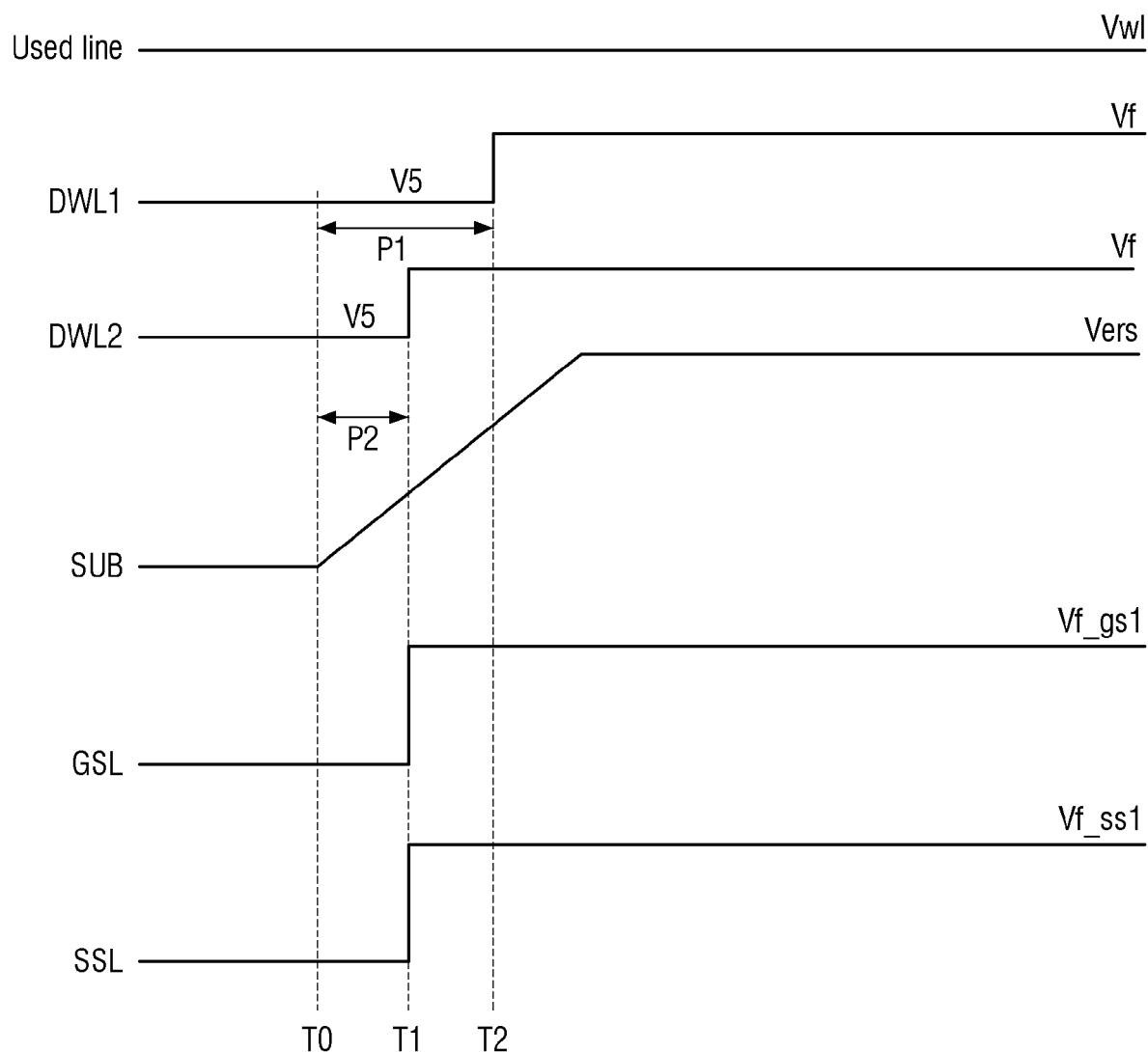
FIG. 22 is a voltage timing diagram for explaining a method of operating the nonvolatile memory device of FIG. 21.

FIG. 21 is an example circuit diagram of a nonvolatile memory device according to embodiments of the present disclosure. FIG. 22 is a voltage timing diagram for explaining a method of operating the nonvolatile memory device of FIG. 21.

Referring to FIG. 21, the circuit diagram of FIG. 19 is the same as the circuit diagram of FIG. 17. That is, a first dummy word line DWL1 may be disposed adjacent to a used line 170, and a second dummy word line DWL2 may be disposed farther from the used line 170.

When it is determined that the first dummy cells DC1 and the second dummy cells DC2 have deteriorated, an erase condition of the first dummy cells DC1 and the second dummy cells DC2 may be changed, and unused line erase voltages applied to the first dummy cells DC1 and the second dummy cells DC2 may be changed. For example, the magnitude of a first voltage V1 may be changed. A corresponding floating voltage may be applied to each of a ground select line GSL and a string select line SSL to put it in a floating state.

Referring to FIG. 22, at a reference time T0, an erase voltage Vers may be applied to a substrate SUB, and a word line erase voltage Vwl may be applied to used lines WL through WLn. Therefore, an erase operation may be performed on the used lines with a voltage difference between the erase voltage Vers and the word line erase voltage Vwl.

At the reference time T0, a first unused line erase voltage transiting from a fifth voltage V5 to a floating voltage Vf at a second time T2 may be applied to the first dummy word line DWL1, and a second unused line erase voltage transiting from the fifth voltage V5 to the floating voltage Vf at a first time T1 may be applied to the second dummy word line DWL2. The fifth voltage V5 may be applied to the first dummy word line DWL1 from the reference time T0 to the second time T2, that is, for a first period P1. The fifth voltage V5 may be applied to the second dummy word line DWL2 from the reference time T0 to the first time T1, that is, for a second period P2. The second time T2 may be later than the first time T1, and the first period P1 may be longer than the second period P2. For example, the fifth voltage V5 may have the same magnitude as the first voltage V1 or may have a smaller magnitude than the first voltage V1.

As described above, since the first dummy cells DC1 may deteriorate more than the second dummy cells DC2, an erase operation should be performed with greater voltage difference between gates of the first dummy cells DC1 and the substrate on the first dummy cells DC1. Therefore, the fifth voltage V5 may be applied to the first dummy cells DC1 for a longer period than to the second dummy cells DC2, and an erase operation may be performed more on the first dummy cells DC1 with a voltage difference between the fifth voltage V5 and the erase voltage Vers.

Figure 23:
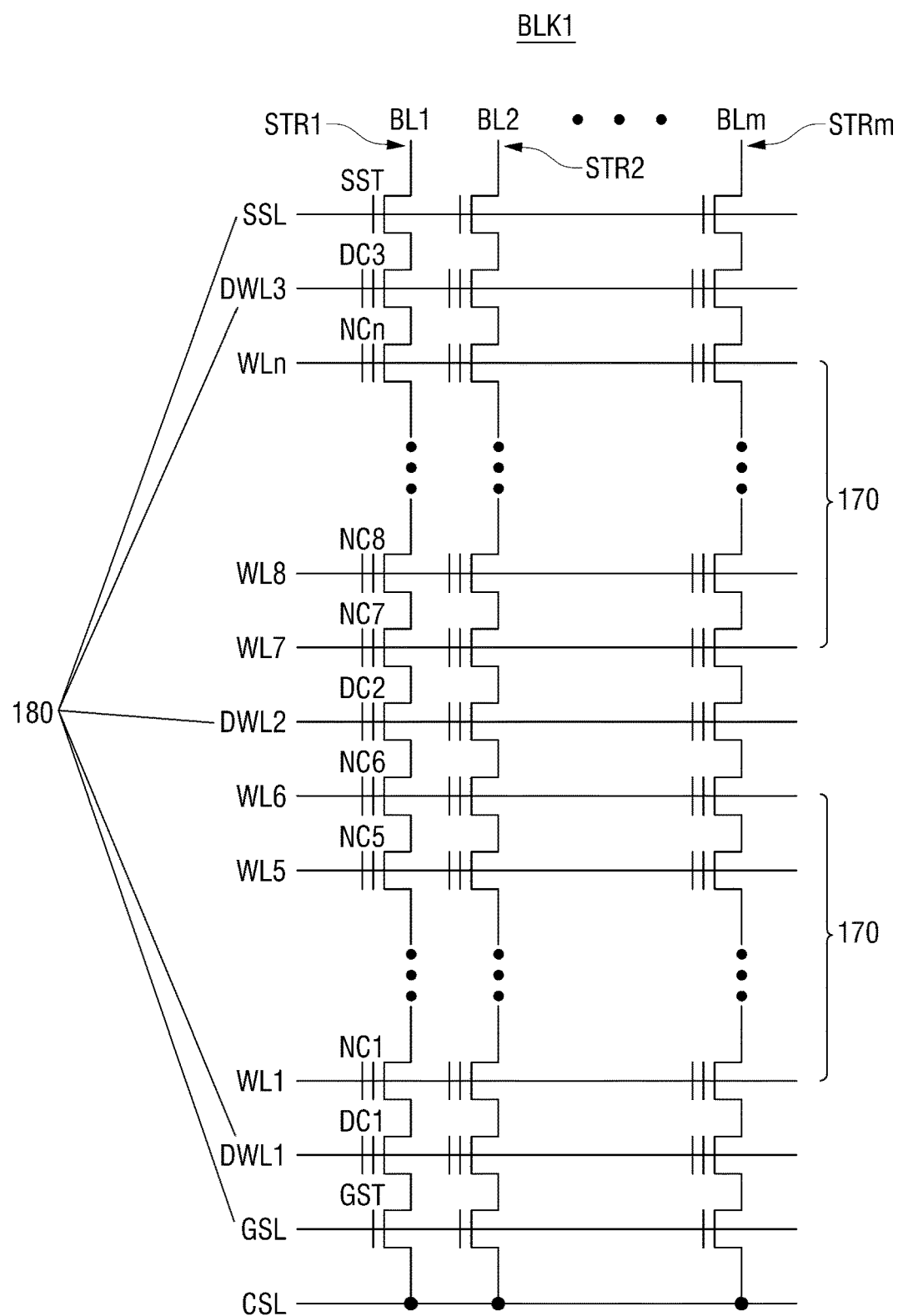
FIG. 23 is an example circuit diagram of a nonvolatile memory device according to embodiments of the present disclosure.

FIG. 23 is an example circuit diagram of a nonvolatile memory device according to embodiments of the present disclosure. The following description will focus on differences from the above-described example diagrams.

Referring to FIG. 23, a memory block BLK1 of the nonvolatile memory device according to the embodiments of the present disclosure may include a used line 170, an unused line 180, and a common source line CSL.

The unused line 180 may be connected to dummy cells and may include a ground select line GSL, a string select line SSL, a first dummy word line DWL1, a second dummy word line DWL2, and a third dummy word line DWL3.

The first dummy word line DWL1 may be disposed between the ground select line GSL and a first word line WL1. The third dummy word line DWL3 may be disposed between an $n^{th}$ word line WLn and the string select line SSL. That is, the first dummy word line DWL1 and the third dummy word line DWL3 may be disposed adjacent to a group of used lines WL1 through WLn.

The second dummy word line DWL2 may be disposed between the used lines WL1 through WLn, that is, between adjacent word lines WL1 through WLn. For example, the second dummy word line DWL2 may be disposed between the sixth word line WL6 and the seventh word line WL7.

For example, when it is determined that first dummy cells DC1 connected to the first dummy word line DWL1 and second dummy cells DC2 connected to the second dummy word line DWL2 have deteriorated, an erase condition of the first dummy word line DWL1 and the second dummy word line DWL2 may be changed. In an example embodiment, an unused line erase voltage applied to each of the first dummy word line DWL1 and the second dummy word line DWL2 and transiting from a first voltage to a floating voltage at a first time may be changed. The magnitude of the first voltage, the first time, or the magnitude of the first voltage and the first time may be changed. The magnitude of the first voltage and/or the first time in the unused line erase voltage applied to the first dummy word line DWL1 and the magnitude of the first voltage and/or a second time in the unused line erase voltage applied to the second dummy word line DWL2 may be controlled differently or identically according to the deterioration of the first dummy cells DC1 and the second dummy cells DC2.

While the present disclosure has been particularly shown and described with reference to exemplary embodiments thereof, it will be understood by those of ordinary skill in the art that various changes in form and detail may be made therein without departing from the spirit and scope of the present disclosure as defined by the following claims. The exemplary embodiments should be considered in a descriptive sense only and not for purposes of limitation.

What is claimed is:

1. A nonvolatile memory device comprising:
a memory block including a ground select line connected a plurality of ground select transistors, a plurality of dummy word lines connected to a plurality of dummy memory cells, and a plurality of word lines connected to a plurality of normal memory cells, wherein the nonvolatile memory device is configured such that the plurality of dummy memory cells are not programmed during a program operation which is performed on the plurality of normal memory cells; and a controller configured to:

receive a first erase command, in response to the first erase command, read the plurality of dummy memory cells before a first reference time point, cause a ground select voltage to be applied to the ground select line, wherein the ground select voltage transits from a first ground select voltage level to a second ground select voltage level at the first reference time point, cause a first dummy word line erase voltage to be applied to a first dummy word line of the plurality of dummy word lines, wherein the first dummy word line erase voltage transits from a first voltage level to a second voltage level at a first time point different from the first reference time point, receive a second erase command, in response to the second erase command, read the plurality of dummy memory cells before a second reference time point, cause the ground select voltage to be applied to the ground select line, wherein the ground select voltage transits from the first ground select voltage level to the second ground select voltage level at the second reference time point, and cause a second dummy word line erase voltage to be applied to the first dummy word line, wherein the second dummy word line erase voltage transits from a third voltage level to a fourth voltage level at a second time point different from the first time point.

2. The device of claim 1, wherein the first time point is later than the first reference time point, and wherein the second time point is equal to the second reference time point.

3. The device of claim 1, wherein the first voltage level of the first dummy word line erase voltage and the third voltage level of the second dummy word line erase voltage are smaller than the second ground select voltage level of the ground select voltage.

4. The device of claim 1, wherein the controller is further configured to cause a third dummy word line erase voltage to be applied to a second dummy word line of the plurality of dummy word lines, and wherein the third dummy word line erase voltage transits from a fifth voltage level, different from the first voltage level, to the second voltage level at the first time point.

5. The device of claim 4, wherein the first voltage level applied to the first dummy word line is smaller than the fifth voltage level applied to the second dummy word line, wherein the first dummy word line is a disposed adjacent to a group of the plurality of word lines, and wherein the second dummy word line is disposed farther from the group of the plurality of word lines than the first dummy word line.

6. The device of claim 1, wherein the controller is further configured to cause a third dummy word line erase voltage to be applied to a second dummy word line of the plurality of dummy word lines, and wherein the third dummy word line erase voltage transits from the first voltage level to the second voltage level at a third time point different from the first time point.

7. The device of claim 6, wherein the first time point is later than the third time point, wherein the first dummy word line is a disposed adjacent to a group of the plurality of word lines, and wherein the second dummy word line is disposed farther from the group of the plurality of word lines than the first dummy word line.

8. The device of claim 1, wherein the first dummy word line is adjacent to a group of the plurality of word lines, wherein a second dummy word line of the plurality of dummy word lines is disposed between two adjacent word lines of the plurality of word lines, wherein the controller is further configured to cause a third dummy word line erase voltage to be applied to the second dummy word line, and wherein the third dummy word line erase voltage transits from a fourth voltage level to the second voltage level at a third time point different from the first time point.

9. The device of claim 1, wherein the first dummy word line is adjacent to a group of the plurality of word lines, wherein a second dummy word line of the plurality of dummy word lines is disposed between two adjacent word lines of the plurality of word lines, wherein the controller is further configured to cause a third dummy word line erase voltage to be applied to the second dummy word line, and wherein the third dummy word line erase voltage transits from a fourth voltage level, different from the first voltage level, to the second voltage level at the first time point.

10. The device of claim 1, wherein the first dummy word line is disposed between two adjacent word lines of the plurality of word lines.

11. A nonvolatile memory device comprising:

a memory block including a string select line connected a plurality of string select transistors, a plurality of dummy word lines connected to a plurality of dummy memory cells, and a plurality of word lines connected to a plurality of normal memory cells, wherein the nonvolatile memory device is configured such that the plurality of dummy memory cells are not programmed during a program operation which is performed on the plurality of normal memory cells; and a controller configured to:

receive a first erase command, in response to the first erase command, read the plurality of dummy memory cells before a first reference time point, cause a string select voltage to be applied to the string select line, wherein the string select voltage transits from a first string select voltage level to a second string select voltage level at the first reference time point, cause a first dummy word line erase voltage to be applied to a first dummy word line of the plurality of dummy word lines, wherein the first dummy word line erase voltage transits from a first voltage level to a second voltage level at a first time point different from the first reference time point, receive a second erase command, in response to the second erase command, read the plurality of dummy memory cells before a second reference time point, cause the string select voltage to be applied to the string select line, wherein the string select voltage transits from the first string select voltage level to the second string select voltage level at the second reference time point, cause a second dummy word line erase voltage to be applied to the first dummy word line, wherein the second dummy word line erase voltage transits from a third voltage level to a fourth voltage level at a second time point different from the first time point.

12. The device of claim 11,
wherein the first time point is later than the first reference time point, and
wherein the second time point is equal to the second reference time point.

13. The device of claim 11,
wherein the first voltage level of the first dummy word line erase voltage and the third voltage level of the second dummy word line erase voltage are smaller than the second string select voltage level of the string select voltage.

14. The device of claim 11,
wherein the controller is further configured to cause a third dummy word line erase voltage to be applied to the second dummy word line of the plurality of dummy word lines, and
wherein the third dummy word line erase voltage transits from a fifth voltage level, different from the first voltage level, to the second voltage level at the first time point.

15. The device of claim 14,
wherein the first voltage level applied to the first dummy word line is smaller than the fifth voltage level applied to the second dummy word line,
wherein the first dummy word line is a disposed adjacent to a group of the plurality of word lines, and
wherein the second dummy word line is disposed farther from the group of the plurality of word lines than the first dummy word line.

16. The device of claim 11,
wherein the controller is further configured to cause a third dummy word line erase voltage to be applied to the second dummy word line of the plurality of dummy word lines, and
wherein the third dummy word line erase voltage transits from the first voltage level to the second voltage level at a third time point different from the first time point.

17. The device of claim 16,
wherein the first time point is later than the third time point,
wherein the first dummy word line is a disposed adjacent to a group of the plurality of word lines, and
wherein the second dummy word line is disposed farther from the group of the plurality of word lines than the first dummy word line.

18. The device of claim 11,
wherein the first dummy word line is adjacent to a group of the plurality of word lines, wherein a second dummy word line of the plurality of dummy word lines is disposed between two adjacent word lines of the plurality of word lines,
wherein the controller is further configured to cause a third dummy word line erase voltage to be applied to the second dummy word line, and
wherein the third dummy word line erase voltage transits from a fourth voltage level to the second voltage level at a third time point different from the first time point.

19. The device of claim 11,
wherein the first dummy word line is adjacent to a group of the plurality of word lines,
wherein a second dummy word line of the plurality of dummy word lines is disposed between two adjacent word lines of the plurality of word lines,
wherein the controller is further configured to cause a third dummy word line erase voltage to be applied to the second dummy word line, and
wherein the third dummy word line erase voltage transits from a fourth voltage level, different from the first voltage level, to the second voltage level at the first time point.

20. The device of claim 11,
wherein the first dummy word line is disposed between two adjacent word lines of the plurality of word lines.

* * * * *